(12) United States Patent
Thompson et al.

(10) Patent No.: US 7,461,049 B2
(45) Date of Patent: Dec. 2, 2008

(54) AUTOMATED CONFIGURATION SYSTEM AND METHOD

(75) Inventors: Joseph H. Thompson, Nashville, TN (US); Randy J. Weems, Lavergne, TN (US); Edward A. Lessman, Nashville, TN (US)

(73) Assignee: Edgenet, Inc., Brentwood, TN (US)

( * ) Notice: Subject to any disclaimer, the term of this patent is extended or adjusted under 35 U.S.C. 154(b) by 608 days.

(21) Appl. No.: 10/669,465

(22) Filed: Sep. 25, 2003

(65) Prior Publication Data

US 2004/0068485 A1    Apr. 8, 2004

Related U.S. Application Data

(63) Continuation of application No. 09/684,907, filed on Oct. 10, 2000, now Pat. No. 6,810,401.

(60) Provisional application No. 60/158,250, filed on Oct. 8, 1999, provisional application No. 60/158,316, filed on Oct. 8, 1999.

(51) Int. Cl.
G06F 7/00 (2006.01)
G06F 17/30 (2006.01)
G06F 17/00 (2006.01)

(52) U.S. Cl. .................. 707/2; 707/100

(58) Field of Classification Search .......... 707/2, 707/10, 100, 101, 5; 706/10, 50, 60; 705/26, 705/33; 709/246, 226
See application file for complete search history.

(56) References Cited

U.S. PATENT DOCUMENTS

| | | | |
|---|---|---|---|
| 5,175,795 A * | 12/1992 | Tsuda et al. ................. | 706/10 |
| 5,293,479 A * | 3/1994 | Quintero et al. ............. | 715/841 |
| 5,311,424 A | 5/1994 | Mukherjee et al. | |
| 5,745,765 A | 4/1998 | Paseman | |
| 5,784,286 A | 7/1998 | Hirose et al. | |
| 5,877,966 A | 3/1999 | Morris et al. | |
| 5,963,953 A | 10/1999 | Cram et al. | |
| 5,966,310 A | 10/1999 | Maeda et al. | |
| 6,064,982 A | 5/2000 | Puri | |
| 6,260,068 B1 * | 7/2001 | Zalewski et al. ............. | 709/226 |
| 6,272,494 B1 * | 8/2001 | Inoue .......................... | 707/100 |
| 6,351,734 B1 | 2/2002 | Lautzenheiser et al. | |
| 6,412,012 B1 | 6/2002 | Bieganski et al. | |
| 6,727,925 B1 | 4/2004 | Bourdelais | |
| 6,865,524 B1 | 3/2005 | Shah et al. | |
| 7,269,664 B2 * | 9/2007 | Hutsch et al. ............... | 709/246 |

OTHER PUBLICATIONS

EPIC Electronic Product Information Corp, Product Brochures, Apr. 1997.
EPIC Product Information Corp., Technology; Software Brochure, May 1992.
EPIC Electronic Product Information Corp., Quick Reference Technology Demo, Mar. 1995.
Edgenet Media, Made 2 Order, Brochure, Rev. Jul. 28, 1998.

\* cited by examiner

*Primary Examiner*—Wilson Lee
*Assistant Examiner*—Merilyn P Nguyen
(74) *Attorney, Agent, or Firm*—Dewitt Ross & Stevens S.C.

(57) ABSTRACT

An automated configuration system (and method) is provided for facilitating the configuration of desired products, services, or other assemblages that require users to gather and assimilate disparate knowledge of makes, models, types, features, codes, and prices of the desired product/service to be configured. In accordance with a preferred embodiment, configuration is facilitated through interaction of a user with a frame engine that performs frame-based inferences to discern stored knowledge of a product (or the like), as supplemented by a rules-based inference system.

20 Claims, 36 Drawing Sheets

FIG. 3

Define Preference Set

Select Preference Questions: 16

- Manufacturer
- Product Type
- Exterior Finish
- Product Category
- Sash Configuration Type
- Produce Configuration
- Family Type (for use with)
- Standard or Custom Size
- Lower Awning Unit Height
- Flanker Unit Width

[Ok] [Cancel]

M20

| Question | Value |
|---|---|
| Exterior Finish | Clad |
| Exterior Finish Color/Option | White |
| Interior Finish Option | Natural |
| Jamb Width | 4 9/16" |
| Grille Option | Colonial |
| Glass Type | Clear IG |
| Tinted Glass Option | No Tint (Clear) |
| Screen Option | Aluminum Mesh Screen(s) |
| Screen Frame Color | White |

14

Library
[Load From]
[Save To]

[Assign] [Clear Previous Selections]
[Remove Value] [Add/Remove Questions]

[Ok] [Cancel]

| QTY. | Product Code RO Width X Height (1) | Ext. Finish (2) | Hinge (3) | Glass (4) | PAS/ RDC (5) | Grille/Divided Light(6) | | | | Jamb Width(7) | Int. Prime (8) | Screen(9) | | Hard-Ware (10) | Balance/Track (11) | | Ext. Trim(12) | Arched Casing (13) | | | ELEV Code |
|---|---|---|---|---|---|---|---|---|---|---|---|---|---|---|---|---|---|---|---|---|---|
| | | | | | | Type | Style | Pattern | Bar | LS IN | | Color | Type | Mesh | | T/P | Style | | Type | Size | Style | |
| | STANDARD UNITS | | | | | | | | | | | | | | | | | | | | | |
| 1 | C2-CAS-1-8x3-OW | WH | LR | OPD | | | | | 1 3/8" | | 4 9/16" | | WH | AM | | | | | | | | |
| 1 | C12-AWN-2-4x1-BW | WH | S/V | OPD | | | | | | | 4 9/16" | | WH | AM | | | | | | | | |
| 1 | C2-DH-2-6x3-2W | WH | | OPD | | | | | 1 3/8" | | 4 9/16" | | WH | AM | | K | PWR | | | | | |
| | Prep For Stool | | | | | | | | | | | | | | | | | | | | | |
| 1 | C2-CAS-1-8x3-OW | WH | LR | OPD | | | | | | | | | WH | AM | | | | | | | | |

EdgeNet, Inc  
Unit Order Form  
Quote #

Customer: Ray Hill  
Location: 461 Ocean Blvd  
Integrity GA 30356  
P.O #

Purchaser: Ray Hill  
Job Name: Pillsbury Residence  
Date: Wed Oct 04 2000

Page ___ of ___  
Ship Date  
S$ ___  %Discount

| 000006 | Pricing Quote/Long Form | Wed Oct 04 | edgenet

EdgeNet, Inc.
6 Cadillac Dr., Suite 260
Brentwood, TN 37027
(877) EDGENET

2000

DATE: Wed Oct 04 2000

QUOTE: 000006  CUSTOMER: Ray Hill  PROJECT: Pillsbury Residence
SALES REP: Jack Spradigan  PO#:  CONTACT: Ray Hill
  TERMS: Net 30 Days  PHONE: (770) 876-3425
COMMENTS:  ADDRESS: 461 Ocean Blvd.
  Integrity GA 30556
  Delivery/Pickup: Delivery EdgeNet, Inc.  PROPOSES TO FURNISH PRODUCTS AS STATED BELOW.

| ITEM FRAME SIZE | LOCATION | PRODUCT CODE DESCRIPTION | UNIT PRICE | QTY | TOTAL PRICE |
|---|---|---|---|---|---|
| 0001 Frame Size=3' 4" Wx3' 0"H RO SIZE=3' 4 3/4" Wx3' 0 1/2"H | | MANUFACTURER: Window Company A C2-CAS-1-8x3-0W Clad Wood Casement Windows Twin Unit (2-Wide) White Exterior Finish Natural Interior Finish Handing: LR 4 9/16" Jamb Width Tempered Clear IG White Regular Handle | | 1 | |
| | | White w/Clear IG Tempered Insul Glass | $ 517.16 | | |
| | | Colonial 5/8" Wood 2W3H Grilles | $ 53.49 | | |
| | | (2) 1-8x3-0 White Aluminum Mesh Screen(s) | $ 33.58 | | |
| | | | $ 604.23 | | $ 604.23 |

Order Form Viewer

Previous Page
Next Page
Print
Close

Project Schedule–Pillsbury Residence

| Item | Product Code | Quantity | Finish | Product Type | Configuration | RO Width | RO Height | Jamb |
|---|---|---|---|---|---|---|---|---|
| 0005 | C2-CAS-1-8x3-0W | 1 | White | Casement Windows. | Twin Unit (2-Wide) | 3' 4 3/4" | 3' 0 1/2" | |
| 0003 | C2-DH-2-0x3-2W | 1 | White | Double Hung Windows | Twin Unit | 4' 4 7/8" | 3' 0 1/2" | |
| 0002 | C12-AWN-2-4x1-8W | 1 | White | Awning Windows | One-Wide/Two-High Unit | 2' 4 1/2" | 3' 4 1/2" | |
| 0001 | C2-CAS-1-8x3-0W | 1 | White | Casement Windows | Twin Unit (2-Wide) | 3' 4 3/4" | 3' 0 1/2" | |

HTML VIEWER

SECTION 08611
WOOD CASEMENT WINDOWS

PART 1—GENERAL

1.01 SECTION INCLUDES

A. Clad Wood Casement windows complete with hardware, glazing, weatherstripping, screens. removable grilles, jamb extensions and all standard or specified anchorages, trim., attachments and accessories.

1.02 RELATED SECTIONS

A. Section 01340–Shop Drawings, Product Data and Samples
B. Section 01610–Delivery, Storage and Handling.
C. Section 01630–Product Options and Substitutes.
D. Section 01710–Final Cleaning: Glass cleaning.
E. Section 06200–Finish Carpentry: Wood trim other than trim furnished by window manufacturer.
F. Section 07900–Joint Sealers: Sill sealant and perimeter caulking.
G. Section 08800–Glazing: Special field glazing other than glazing furnished by window manufacturer.
H. Section 09900–Painting: Paint or stain finish other than factory applied finish.

Edit  Print  Done

AUTOMATED CONFIGURATION SYSTEM AND METHOD

This application claims priority to U.S. Provisional Patent Application No. 60/158,250, filed Oct. 8, 1999, and U.S. Provisional Patent Application No. 60/158,316, filed Oct. 8, 1999, which are both hereby incorporated by reference in their entirety. This application is a continuation of application Ser. No. 09/684,907, filed Oct. 10, 2000 now U.S. Pat. No. 6,810,401, the subject matter of which is incorporated by reference herein.

BACKGROUND

In the building and construction industry, job estimation is a time-consuming and costly process. In order to appropriately estimate the cost of any job an individual must assemble both the correct product to satisfy the engineering criteria of a given project and then assemble prices from a variety of data sources. Complex estimates compound the work and cost of this process. In a complex project, estimates are often assembled from a combination of pricing sources. These estimates require both a structured and intimate understanding of the product, its technical specifications, and costs.

SUMMARY

An automated configuration system (and method) is provided for facilitating the configuration of desired products, services, or other assemblages that require users to gather and assimilate disparate knowledge of makes, models, types, features, options, limitations, codes, and prices of the desired product/service (or group of the same) to be configured. In accordance with a preferred embodiment, configuration is facilitated through interaction of a user with a frame engine that performs frame-based inferences to discern stored knowledge of a product (or the like), as supplemented by a rules-based inference system.

BRIEF DESCRIPTION OF THE DRAWINGS

FIG. 3 is an exemplary illustration of a product Selection and Configuration display in accordance with a preferred embodiment of the invention;

FIG. 4 is an exemplary illustration of a Preferred Answer display in accordance with a preferred embodiment of the invention;

FIG. 5 is an exemplary illustration of a Standard Answer display in accordance with a preferred embodiment of the invention;

FIG. 10 is an exemplary illustration of a Catalog Page display in accordance with a preferred embodiment of the invention;

FIG. 13 is an exemplary illustration of a Pricing display in accordance with a preferred embodiment of the invention;

FIG. 14 is an exemplary illustration of an Accessories Module in accordance with a preferred embodiment of the invention;

FIG. 16 is an exemplary illustration of an Order Form display in accordance with a preferred embodiment of the invention;

FIG. 17 is an exemplary illustration of a Quotes display in accordance with a preferred embodiment of the invention;

FIG. 18 is an exemplary illustration of a Schedule Generator display in accordance with a preferred embodiment of the invention;

FIG. 19 is an exemplary illustration of a Product Specifications display in accordance with a preferred embodiment of the invention;

FIG. 21a and 21b are exemplary illustrations of a Project Information Management display in accordance with a preferred embodiment of the invention;

FIG. 22a and 22b are exemplary illustration of a Sales-Representative Information Management display in accordance with a preferred embodiment of the invention;

FIG. 23a and 23b are exemplary illustration of a Client/Customer Information Management display in accordance with a preferred embodiment of the invention;

DETAILED DESCRIPTION

Preferred embodiments and applications of the invention will be described herein. Other embodiments may be realized and structural or logical changes may be made to the embodiments without departing from the spirit or scope of the invention. Although the preferred embodiments disclosed herein have been particularly described as applied to a configuration system and method for configuration of specific exemplary products (e.g., windows and doors), it should be readily apparent that the invention may be embodied to provide configuration and estimation functionality for any number of products, services or the like where configured, customized or assembled-to-order products/services are evaluated, selected, purchased, sold, supported, or otherwise considered.

In accordance with a preferred embodiment of the invention, a configuration system (and corresponding method) is embodied in a single (or multiple) processor-based system that may be supported in a stand-alone, networked, mainframe, or client-server architecture. A single (or multiple) program memory module is provided for storing one or more computer programs used to perform the functionality described herein.

In accordance with a preferred embodiment, one or more user interfaces are provided as part of (or in conjunction with) the configuration system to-permit users to interact with the system. Individual ones of a plurality of client devices (e.g., network/stand-alone computers, personal digital assistants (PDAs), WebTV (or other Internet-only) terminals, set-top boxes, cellular/PCS phones, screenphones, pagers, kiosks, or other known (wired or wireless) communication devices, etc.) may similarly be used to execute one or more computer programs (e.g., universal Internet browser programs, dedicated interface programs, etc.) to allow users to interface with the configuration system.

In accordance with a preferred embodiment, a user (e.g., consumer, sales-representative, buyer, seller, contractor, builder, architect, consultant, organizer, project coordinator, etc.) of the configuration system interacts with the system to configure and/or estimate the cost of a desired product, component, or project. The interaction with the system is preferably through a series of questions provided by the system with input answers provided by the user. The interactive nature of the system aides the user in arriving at the desired product, component, or project selection and the production of any corresponding information (e.g., layouts, pricing, schematics, specifications, etc.).

Figure 1:
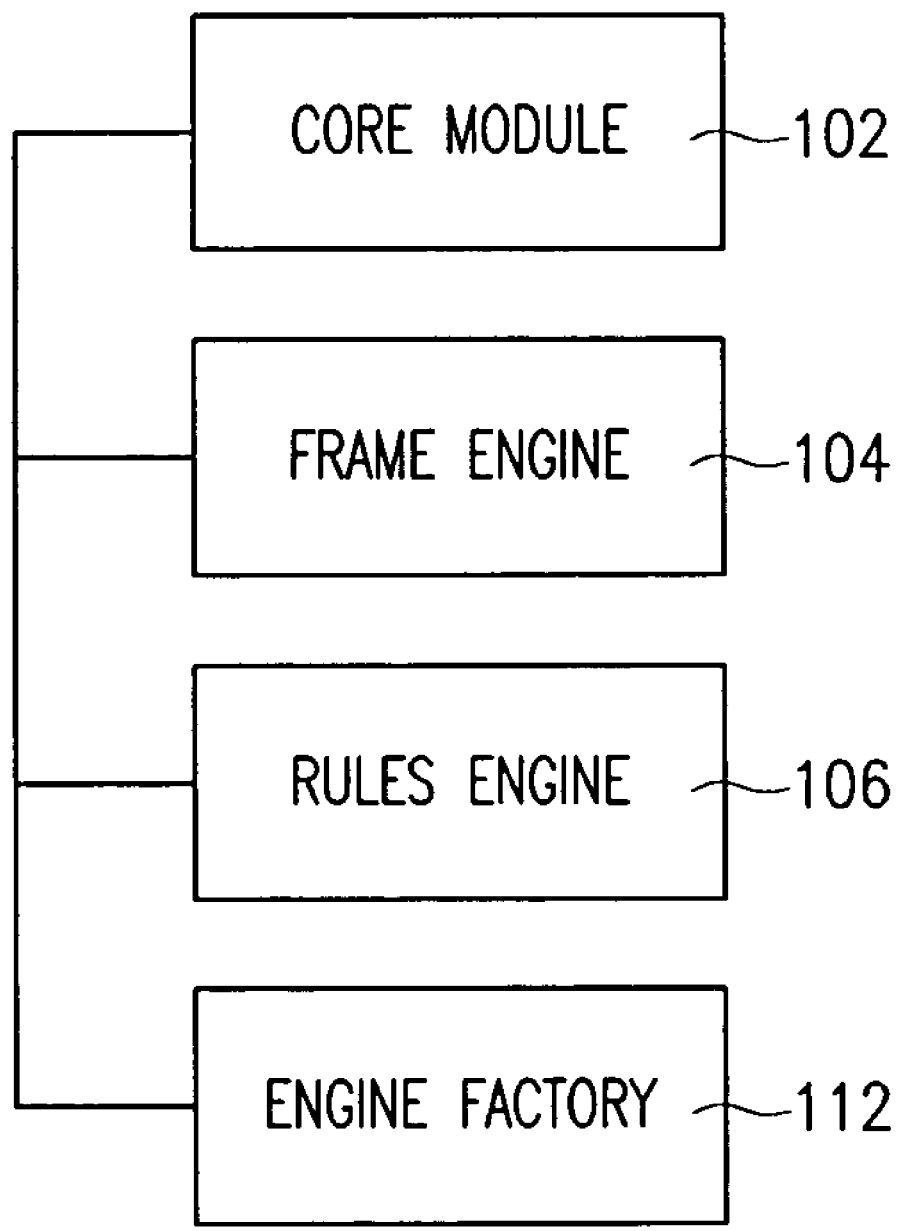
FIG. 1 is a block diagram illustrating a configuration device in accordance with a preferred embodiment of the invention.

FIG. 1 illustrates in block diagram form a configuration device in accordance with a preferred embodiment of the invention containing the Core 102, the Frame Engine 104, and the Rules Engine 106 subsystems or modules (described in detail below).

Core 102 is a processing module that can contain a variety of miscellaneous functions for the system. Core 102, for example, may be used to take a user's input and standardize that input. For example, if the user inputs "2 feet, 3 inches," Core 102 can include functionality that converts that input solely to inches (or another unitized number, e.g., metric units). Another function that may be incorporated in Core 102 is a messaging system that contains all the codes for dynamically loading the other modules. Generally, any functions that may facilitate the processing of input/output data in the system may be incorporated in Core 102.

Preferably, Frame Engine 104 is a frame-based inference engine used to process product knowledge, which may be supplemented by an interpreted rules system, based on input data from Core 102 (or other modules) and from users of the system. In accordance with a preferred embodiment, user data is input through user input of answers to a series of questions regarding configuration of a desired product or project posed by the system (as will be discussed in detail below). In accordance with a preferred embodiment, Frame Engine 104 computes available configuration answers for any configuration questions posed to a user at any time (e.g., in any order), and processes the user's answer to such question. When given the value of one or more answers, Frame Engine 104 infers the values of answers to other questions automatically, and thus, eliminates the need for excessive rule constructs, as typically required in a rules-based engine. Through inference, Frame Engine 104 may also remove or insert questions (and their associated answers) based on the user's previous response(s).

In accordance with a preferred embodiment of the invention, Frame Engine 104 is primarily constructed using a frame-based design concept of knowledge organization, representation, and product classification. Frame-based and rule-based expert systems encode knowledge using fundamentally different models.

In the context of product configuration, the problem an expert system is supposed to solve is as follows: given a set of options ("questions" to be presented to the user), each of which has a set of legal attributes ("values" with which the user may answer the questions), how are the options/attributes themselves related to each other (which options/attributes remove [or 'constrain away'] other options/attributes, which options/attributes are 'interdependent', etc.).

As an example, if the user has answered options A, B, and C with attributes x, y, and z, the expert system must then determine what are now the legal attributes for some other option D. In order to do this, an expert system first has to encode the relationship between the options in some manner (i.e., represent the knowledge). Then, as the expert system is provided current choices as inputs in real time (i.e., "the user has answered options A, B, and C with attributes x, y, and z"), the system must now apply its encoded knowledge to the problem "what are the legal attributes for D" in order to supply the solution(s).

A rule-based expert system generally represents knowledge using a large collection of If-Then-Else constructs (i.e., "If the user has answered option 'A' with attribute 'x', Then attribute 'y' is no longer available for option 'B', Else . . . "). This approach, however, is a unidirectional encoding: if the conditional portion (the user has answered option 'A' with attribute 'x') of the statement is true, the resultant portion must also be true (attribute 'y' is no longer available for option 'B'). The converse (if attribute 'y' is no longer available for option 'B', then the user has answered option 'A' with 'x') is not necessarily true, nor in general should it be.

However, a rule-based expert system requires that the inverse rule must be written separately if it is deemed necessary. If the product knowledge being modeled is complex, the required rules and inverse rules can grow into a very large number. In addition, applying this type of knowledge representation to the problem "the user has answered options A, B, C with attributes x, y, z; now what are the legal attributes for this other option D?" involves using an interpreter or compiler that understands the rule syntax so as to apply the rules to the problem.

On the other hand, the frame-based Frame Engine 104 encodes knowledge in an entirely different manner that does not suffer from this "inverse rule" problem. At its most fundamental level, Frame Engine 104 represents knowledge in a hierarchical tree-like structure. The nodes of the tree are generally called "frames" (e.g., corresponding to product categories) and each node contains a collection of "slots" (e.g., corresponding to product features and options). A slot is a one-to-many relationship between an option and a subset of the legal values (e.g., attributes) for that option.

Textually, a slot is represented as follows:

A=x, y, z where 'A' is an option, and 'x', 'y', and 'z' are attributes for option A.

In general, a frame contains multiple slots, and has child frames as well (because of the tree structure). Conceptually, all the slots in a frame "go together." If at least one of the slots in a frame is found to be invalid (e.g., Slot "A=x, y, z" is in a particular frame, but the user has answered 'A' with attribute 'w'), then the entire frame (along with all of its other slots and all of its child frames) is invalid. Functionally, products and attributes in such a frame are removed from the configuration process. Applying this knowledge representation to the problem "the user has answered options A, B, and C with attributes x, y, and z, now what are the legal attributes for this other option D" involves Frame Engine 104 first marking the appropriate portions of the tree invalid as the user supplies answers to options. Then, to actually provide an answer to the question "what are the legal attributes for some other option D," the engine will look for all the frames which have not been marked invalid and which reference 'D' (i.e., have a slot involving 'D') and then combine all the attributes found in these slots (eliminating any duplicates). At the conclusion of this process, the answer (in many cases, a multi-faceted answer in terms of associated data [a price, an image, a set of drawings, etc.]) is generated and displayed.

In accordance with a preferred embodiment of the invention, a Product Knowledge Builder module may be provided for use in constructing, storing and interrelating data concerning products, components, configurations, etc. to optimize the operation of Frame Engine 104.

The Product Knowledge Builder allows the entry of product knowledge in an intuitive hierarchical fashion. The knowledge is entered into a tree-like structure very similar to the Windows File Manager or Explorer. Once the product knowledge has been entered, this tool "builds" the knowledge into a single output file. This process both compiles the knowledge into a hierarchical tree structure and then optimizes it. The output file is then ready to be processed by Frame Engine 104.

The following simple example will illustrate the differences between an If-Then-Else rule based system and one utilizing Frame Engine 104 in accordance with a preferred embodiment of the invention:

There are four people who are identified by a letter, color, and number.

Jim is A, Blue, and 3.
Ted is B, Red, and 2.
Randy is A, Red, and 4.
Roy is B, Blue, and 2.

The first screen in an application would prompt the user for choosing a letter. (As an additional requirement, the questions can be answered in any order, and the user might skip the first screen and come back to it later.) The If-Then-Else rules to handle such option/attribute pairs are as follows:

if Color has no answer and Number has no answer then
    Letter is A or B

-continued else if Color has no answer then
    if Number is 3 or Number is 4 then
        Letter is A
if Number is 2 then
    Letter is B
else if Number has no answer then
    Letter is A or B
else if Color is Blue and Number is 3 then
    Letter is A
else if Color is Red and Number is 2 then
    Letter is B
else if Color is Red and Number is 4 then
    Letter is A
else if Color is Blue and Number is 2 then
    Letter is B Two more sets of rules will still have to be written for the Color screen and the Number screen. The difficulty of adding a new person to the data or, adding another class of question (e.g.. to determine the group's favorite fruit) can easily be seen. It is also useful to remember that this sample data is intended to be a trivial example. In contrast, the Product Knowledge Builder would permit the entry of that same data as follows.

After adding the three questions to the system, add the following compound slot:

| LETTER | COLOR | NUMBER | PERSON |
|--------|-------|--------|--------|
| A | Blue | 3 | Jim |
| B | Red | 2 | Ted |
| A | Red | 4 | Randy |
| B | Blue | 2 | Roy |

To add a new person, a new row is simply inserted, adding the new person's letter, color, number, and name. To add another question such as the group's favorite fruit, a new column is simply added to the slot, and a list of everyone's favorite fruit can be added.

While the actual algorithm for Frame Engine 104 as implemented is likely to be much more complex, the following illustration of the operation of Frame Engine 104 used to implement the above example may be useful:

In the beginning of a configuration session all frames are valid, and the example above has four frames, one for each row. When asked for the list of available answers for any question, the Frame Engine looks down the column for that question. If the row is valid, its answer is added. Accordingly, for the Letter question, Frame Engine 104 sees A, B, A, B. The duplicate answers are combined to arrive at A, B. Now suppose the user answers A. This means unless the frame has Letter=A, it is invalid. The second and fourth rows are thus invalid. Next the user is presented with the Color question. To find the answers, search down the Color column; the result is Blue and Red for the available answers (Blue from the first row and Red from the third). The user picks Blue. This choice makes the second and third rows invalid.

As a result, there is only one valid row left, the first row. The user has effectively finished the selection process by answering only two of the three questions.

Frame Engine 104 is particularly useful when applied to real-world, complex product knowledge challenges. Real-world product knowledge contains relationships between products, knowledge common among similar products, knowledge common among different products, and exceptions to all of the above. The Product Knowledge Builder in accordance with a preferred embodiment contains constructs to handle all of these scenarios.

Figure 31:
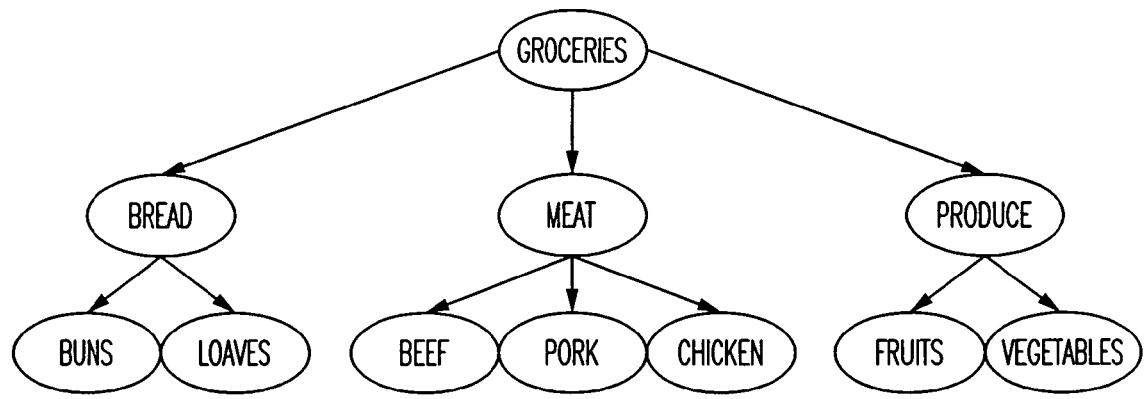
FIGS. 31 and 32 are illustrations of the hierarchical structures used in accordance with a preferred embodiment of the invention.
Figure 32:
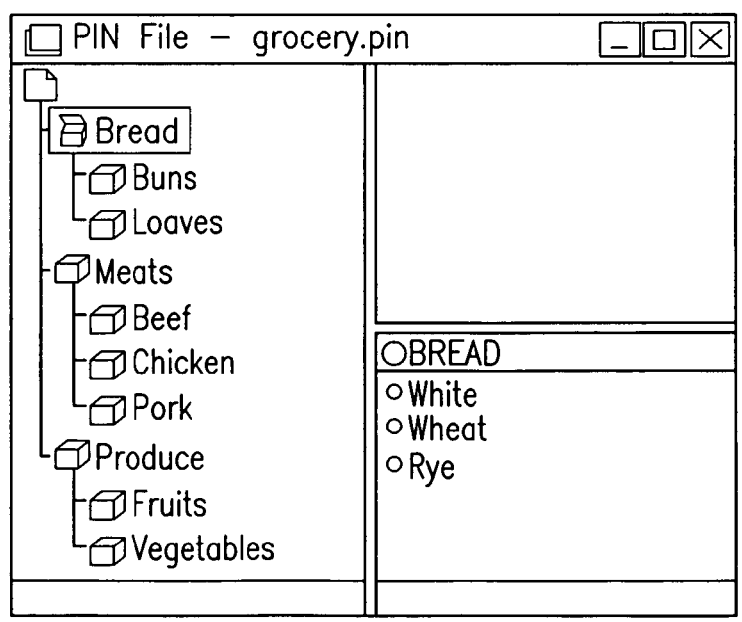

An important relationship among products can be expressed as: "Product A is a type of Product B" (e.g., a casement is a type of window, a car is a type of vehicle). This relationship is called inheritance. Inheritance is a parent to child relationship, but not in the traditional sense. In human beings, if a parent has a trait, the child may or may not share that trait (e.g., brown hair). In this form of knowledge inheritance, the child must inherit all traits. Inheritance is important, because it allows the software engineer to combine all the identical traits for the children in one logical place: the parent. It is for this reason that the Product Knowledge Builder works in a tree-like fashion. Each frame is a parent with children, which in turn have their own children. For example, if there were a system for selecting groceries, the logical way to organize the data would look something like that shown in FIG. 31. The Product Knowledge Builder allows the construction of this tree with the result illustrated in FIG. 32.

As illustrated, when the Bread frame is selected, there is a trait defined as bread. This means that all types of buns and loaves can be made out of White, Wheat, or Rye bread, because both Buns and Loaves inherit from Bread. If any special types of Buns were defined by adding "children" to the Buns frame (i.e., hamburger or hot dog) these new types also inherit White, Wheat, or Rye. Children inherit everything from their parents, grandparents, and great grandparents, all the way up the tree. In the future, if the store added Pumpernickel and carried it for all types of bread, such information could be added to the Bread frame. If the store offered Pumpernickel for Loaves only and not Buns, then Pumpernickel could be added to the Loaves frame. Without the power of inheritance, Pumpernickel would have to be manually added to every type of bread. There are some types of product knowledge that may be shared among different frames in the tree, but which cannot use inheritance. In the groceries example, a trait of this sort would be packaging. Not all groceries come in packages, and sometimes the same kind of product might be available with or without packaging (for example, packaged bread versus bread from the deli). If packaging is available, there will be some product knowledge that applies to all packaging (e.g., servings per container). There is still a need to keep this type of knowledge in a single place for ease of maintenance, and this methodology as incorporated by the Product Knowledge Builder is called frame re-use. A frame can be defined by itself to represent such knowledge, which can then be added into the tree at whatever points are appropriate.

In accordance with a preferred embodiment, although Frame Engine 104 is a frame-based inference engine, it also includes the ability to process data using rules files, making Frame Engine 104 more of a hybrid engine. It is foreseeable that some custom answers are more conveniently handled using rules files rather than building the product knowledge. A rules-based filtering methodology may be used, for example, for filtering output from Frame Engine 104 to comply with certain rules established for a particular product, component, configuration, project, or the like. Similar filtering of unwanted answers, or inapplicable questions may be useful. Rules-based functionality may also be used to add special answers, perform calculations, generate user warnings, or any other special processing required for specific system implementations.

In accordance with a preferred embodiment, Rules Engine 106 may be added to supplement the operation of Frame Engine 104. Rules Engine 106 is typically employed to handle special cases, exceptions, and functionality that are specific to a product line or product series. Rules Engine 106 may also be employed to perform all (or some of) the rules-based functionality (discussed above) as utilized by Frame Engine 104.

In accordance with a preferred embodiment, any number of additional modules may be added to serve a supportive and optional role (called on an "as-needed" basis). A Pricing Engine, for example, may be added that uses data from Frame Engine 104 and/or Rules Engine 106 to generate prices. Price reports can be graphically generated and prices can be calculated and displayed to the user in multiple currency types. A CAD Engine Module may be added to read CAD drawings and enable multiple CAD drawings to be displayed simultaneously, with separate components to be overlaid upon one another to form a complex illustration. Specifically, the CAD Engine may handle the determination of which components need to be overlaid and may present a list of the files containing the required components to a CADView control (not shown), which may in turn read the AutoCAD files and display the components on the user interface. The CAD Engine may also print, copy or otherwise output the CAD files.

Figure 2:
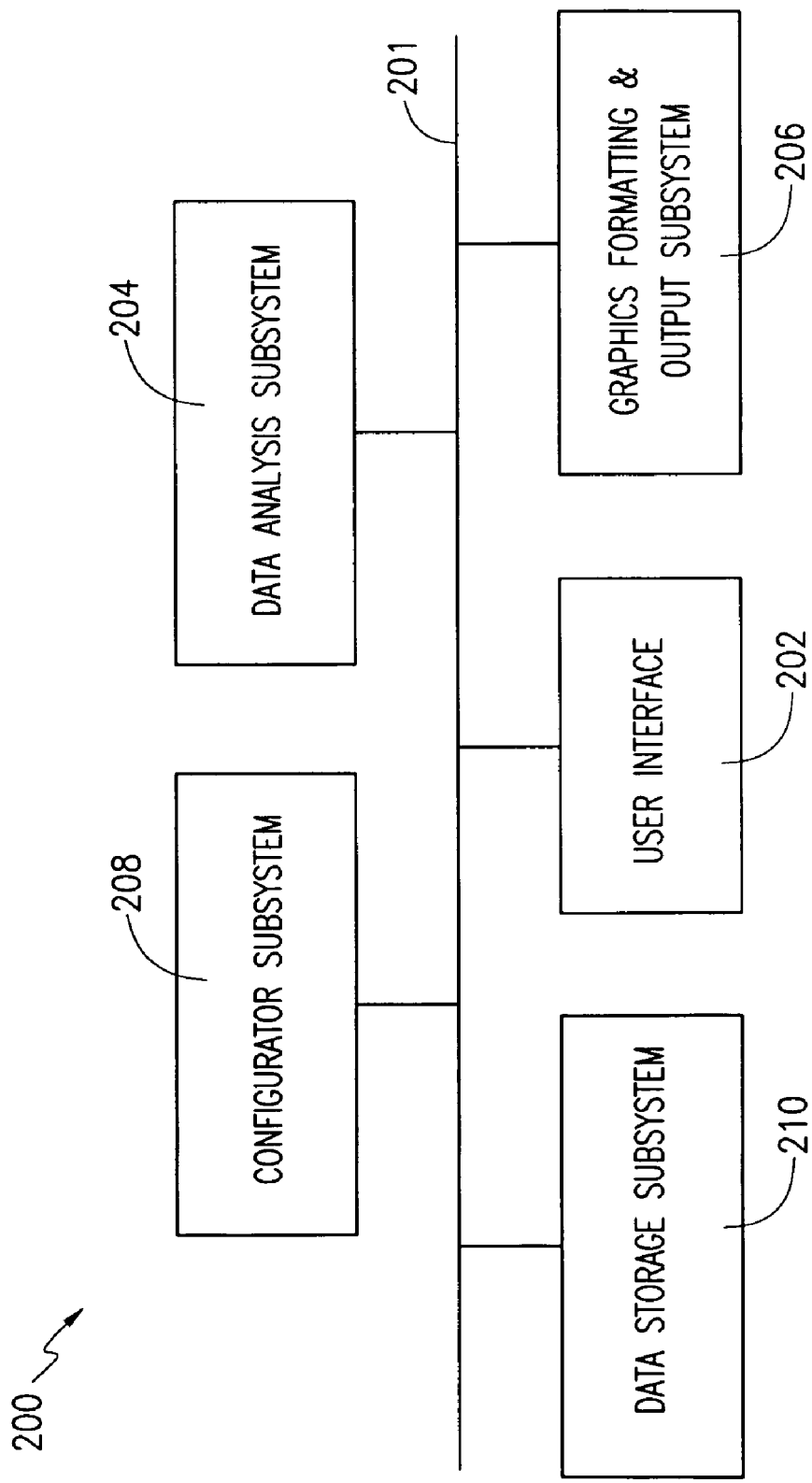
FIG. 2 is a block diagram illustrating a configuration system in accordance with a preferred embodiment of the invention.

FIG. 2 illustrates a configuration System 200 in accordance with a preferred embodiment of the invention. Specifically, System 200 may include a User Interface Subsystem 202, Data Analysis Subsystem 204, Graphics Formatting Output Subsystem 206, Configuration Subsystem 208, and Data Storage Subsystem 210.

User Interface Subsystem 202 enables the interaction between the user and the system. It may interact with any component of the system. Graphics Formatting and Output Subsystem 206 performs calculations and preparations for the display of graphical and/or textual representations to the User Interface 202. This subsystem may include a variety of graphical modules such as a Parametric Drawing Module, a Schematic Configurator, a CADControl/CADVU Module, a Bid Quote Generation Module, a Specification Generator Module, etc.

Data Analysis Subsystem 204 accesses and processes data from the Data Storage Subsystem 210 and provides results to the Configurator Subsystem 208 (or other modules as required). The Data Analysis Subsystem 204 may contain a variety of analytical and computational modules such as a Regular Expressions Engine, a Product Code Engine, a Pricing Engine, a Mulling Engine, etc.

Configurator Subsystem 208 (an example of which is shown in more detail in FIG. 1, as described above) processes questions presented to the user and the answers received from the user. Based on the data in the Data Storage Subsystem 210 and the established data relationships, the Configurator 208 builds the product configuration. The Data Storage Subsystem 210 may serve as the data repository for the collective knowledge of the system. Product knowledge and pricing data may be stored in Data Storage Subsystem 210 to be used by the various modules. The Data Storage Subsystem 210 may include a variety of memory modules such as a Repository Module, a Pacifier Module, a Buffer Module, an Import/Export Module, a Preferences Module, etc. The Data Storage Subsystem 210 may also store the series of questions to be selected (e.g., by Frame Engine 104, by Rules Engine 106, etc.) for output to the user interface in response to configuration data input from the user interface.

The Parametric Drawing Engine that may be added to the system takes descriptions of configured products, and produces an accurate representation of the product. As an example, the parameters used as input data descriptions can include the width or height of a window, or the existence of grilles. From these descriptive parameters, this module will generate a drawing (e.g., an elevation) or other dimensional product aspect for review by the user (such drawings can be converted to CAD format at the user's option).

The Parametric Drawing Engine can also export its drawings for use in other applications (e.g., AutoCAD, in the event that the parametric drawing will be used by an architect). The Parametric Drawing Engine may also tie into other modules such as a Schematic Configurator. The Schematic Configurator is a user interface module and inference tool. Using the Schematic Configurator, the user can view a line drawing representing a configured product (e.g., window) on the user interface, and add other units to the product. Thus, the end user might start out with a single unit and he/she might then add two flanking windows, one on either side of the product. The user can designate which sides to add windows and can even add other product types, such as a round-top window above. The Schematic Configurator can interface with the Frame Engine 104, seeking matching components to the previously selected configuration. Frame Engine 104 will match appropriate products between the two modules based on any number of product attributes and parameters.

A Preferences Module may also be included in the system. A Preferences Module allows the user to define a set of preferred answers for questions applicable to products in a project. In a preferred embodiment, the set of preferred answers may be based on user selected preferences, regional specification preferences, manufacturer compatibility preferences, etc. As an example, the user can initiate a project and choose "white clad" windows. The user can then set "white clad" as a preference for that entire project. As a result, for every item that the user configures for the project, the system will reference the Preferences Module and will automatically retrieve the preference values by default and override other items. The Preferences Module can also automatically inform a user that the selected preference is unavailable for a given product during the configuration of that product.

EXAMPLES

As an illustration of exemplary commercial embodiments of the invention, the following descriptions of the invention as variously implemented in different iterations of a system for (and method of) configuring window products is provided below.

In this exemplary embodiment, the system can display the entire structure of product knowledge associated with the desired product or product line. In particular, two "lists" are displayed in the primary product selection and configuration screen shown in FIG. 3: one for questions 10, and one for answers 12.

In a typical usage scenario, the user starts at the beginning of a question list, the first of which may present the user with a certain product type, such as a window or a door. As questions 10 are answered by the user, other questions 10 that no longer apply are automatically removed from the list. In some cases, answering questions 10 will actually add new questions 10 to the list or will automatically answer other questions 10. Because the entire product knowledge structure is always accessible, the user can answer questions 10 in whatever order is desired, although the default order is generally designed to reflect the flow of a typical product configuration.

If the user selects "window," the configuration system directs questions to develop answers pertinent to window configurations only.

Referring to FIG. 4, preferred answers 14, or Preferences, are pre-determined questions 10/answer 12 pairs consisting of any combination of product attributes which will be used repeatedly. Preferences may be useful to save time on large projects or jobs, and a preference set 16 is typically determined for specific product attributes that fit a particular purpose. Once a preference set 16 is defined, it can be used repeatedly thereafter to save time in the product selection process. If the user activates Preferences, the system will automatically select the question 10/answer 12 pairs in the preference set 16 and apply them to the product being configured at runtime. Any number of question 10/answer 12 pairs can be set up as preferred values. Libraries of Preferences may be saved to files for use with repeat customers or recurring product requests.

Figure 5:
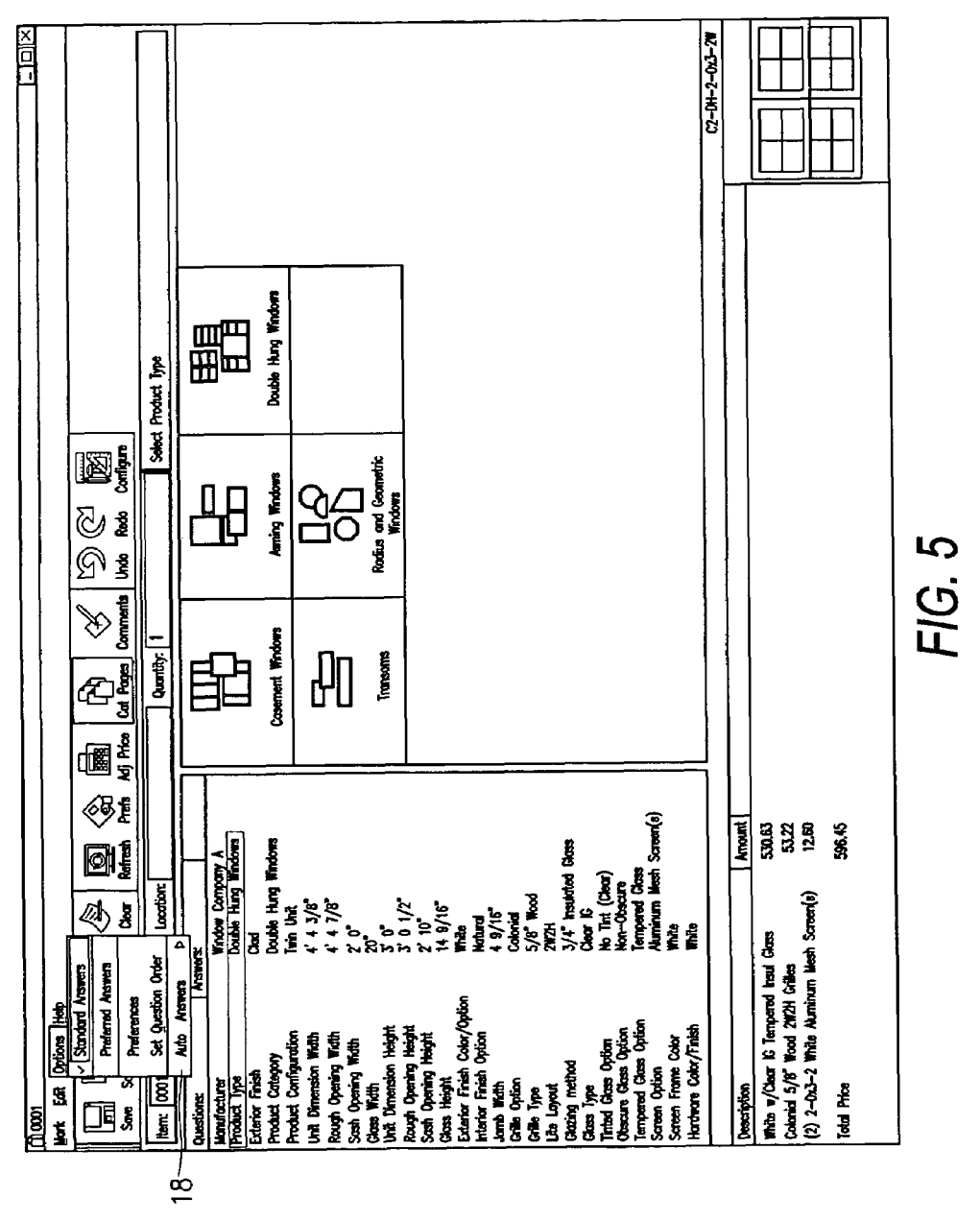

Referring to FIG. 5, Standard Answers 18 is a feature providing the ability to display to the user the "standard" answer 12 for a particular product attribute. Standard Answers 18 can also be automatically selected similar to Preferences and are flexible enough to be changed by the user during the configuration process (i.e., Standard Answers can be applied to some products in a project but not to others). If the user activates Standard Answers 18, the system will automatically answer 12 all questions 10, which have answers defined as "standard" and apply them to the product being configured at runtime.

Figure 6:
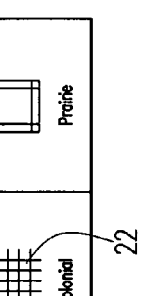
FIG. 6 is an exemplary illustration of a Graphic Selection display in accordance with a preferred embodiment of the invention.

Referring now to FIG. 6, Graphic Selection is a feature which provides a graphic representation 20 of attributes (if applicable), which can represent an answer more clearly 12 than a text description. This feature is particularly useful for the illustration of attributes that would otherwise require either extensive text description or which can be better shown with an image 22. The Graphic Selection array can accommodate a range of static or "animated" electronic representations, including portable network files, metafiles, bitmaps, or other graphic representations.

The system also provides Custom Answers. Custom Answers is a feature designed to accommodate direct user input for an answer 12 for which there exists one of the following conditions: 1) an acceptable range of incremental values (e.g., dimensional variables); 2) values defined as "other than the values presented" (e.g., custom operation of a twin casement window); or 3) values that are completely undefined. When a particular question 10 permits custom value answers 12, the Custom Answers box can automatically appear. The system allows the user to enter custom values for dimensional attributes such as unit dimension width, unit dimension height, etc.

Ultimately, the questions 10 and answers 12 guide the user to a desired configured product. From that point, the invention can accurately calculate how much the configured product is going to cost. In addition, the consumer can obtain detailed product information, including specifications that follow standard formats for engineering and architecture.

Figure 8:
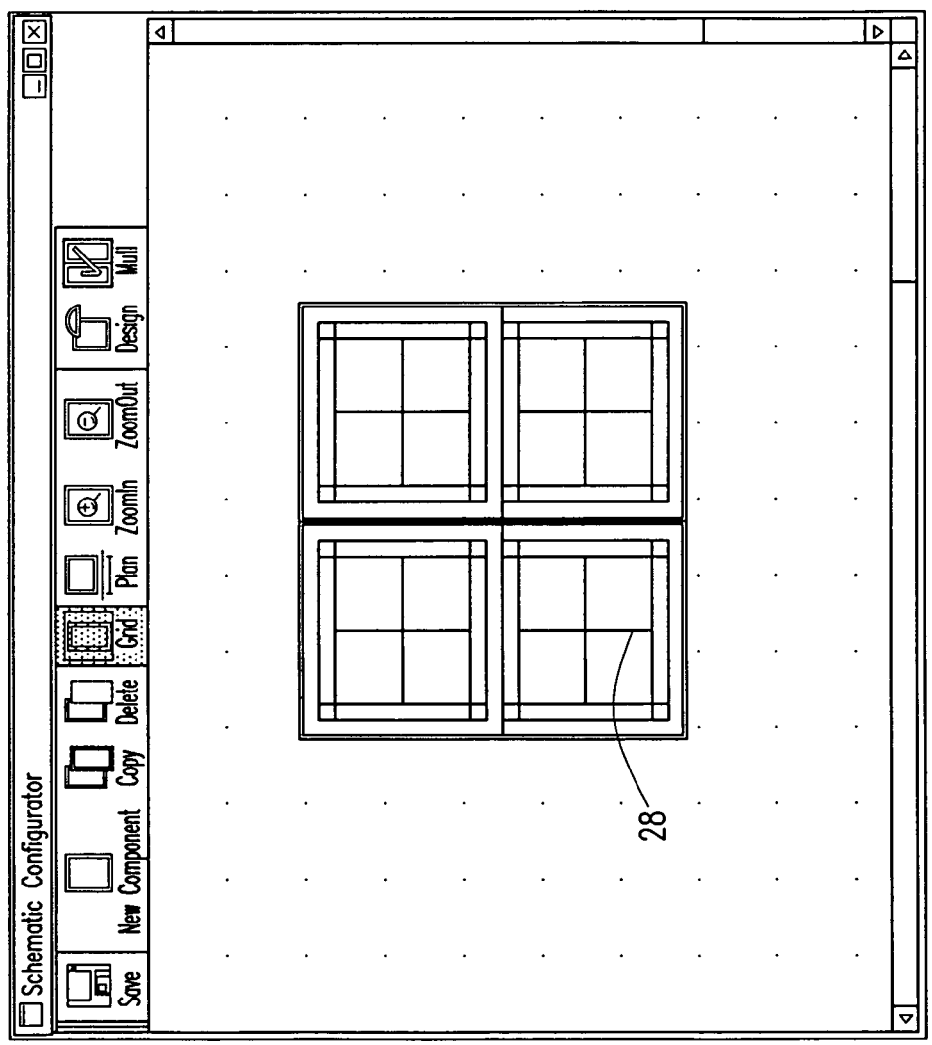
FIG. 8 is an exemplary illustration of a Standard Parametric Drawings display in accordance with a preferred embodiment of the invention.

Referring to FIG. 8, Standard Parametric Drawings 28 can be generated based on the dimensions of a manufacturer's existing products. Parametric drawings 28 can apply to any product where "views" (e.g., front, top, side) of the product are defined as product attributes. Custom Parametric Drawings 28 can also be generated in accordance with the preferred embodiment of the invention if the value range(s) for the drawings of the applicable products can be defined.

The Schematic Configurator (SC), is used in this example as a tool designed to allow the user to manipulate parametric drawings 28 of products. Using "Drag and Drop" techniques, the user can design and view a variety of product elevations, manipulate individual components, and graphically edit composite unit designs. The SC module can also be used to select and configure products, as well as manipulate, scale and assemble both pre-defined and custom shapes and sizes into composite units. The SC also allows the elevation designs to be printed, copied and exported for use in other software applications (e.g., CAD). All pricing information driven by the manipulation of product components may be tracked including mulling charges, custom grille pattern designs, grille types, etc. As a unit is configured, the SC gathers the dimensional information and processes it to display an elevation. When a unit configuration is complete, it can be viewed in the SC where any necessary changes can be made (dimensional changes as well as other attribute changes) and other units can be added.

Figure 9:
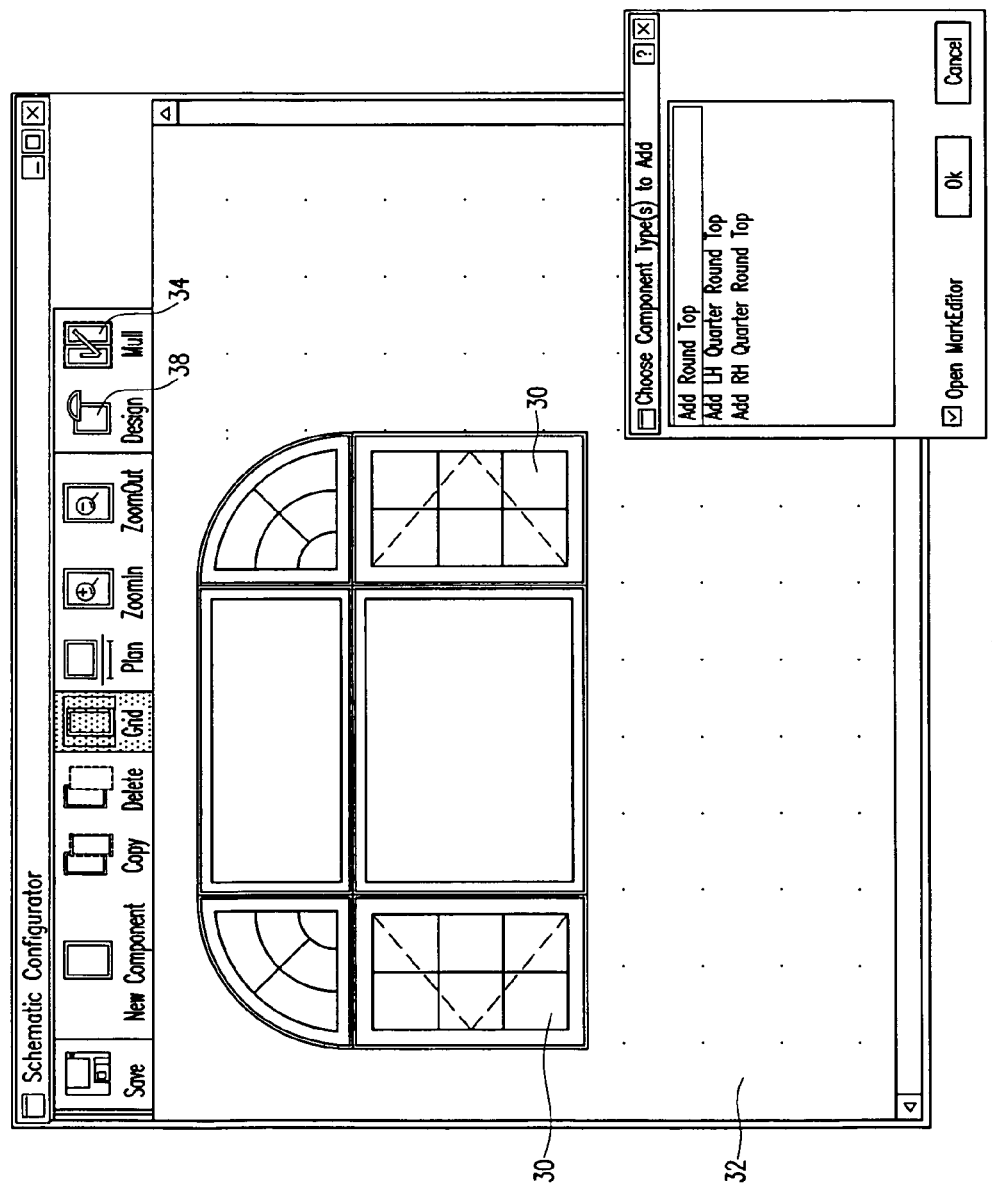
FIG. 9 is an exemplary illustration of a Composite Unit Design display in accordance with a preferred embodiment of the invention.

Referring to FIG. 9, composites of products can be created. Composite unit design, assembly and verification are controlled through the SC. When more than one single unit 30 is placed together in the SC, a Custom Composite Unit 32 is created. This placement can be verified by clicking the Mull button 34.

Other products can be added to a product already displayed in the SC with three different methods: 1) the Copy function, which creates an exact copy of the selected item; 2) the New Component function, which calls the Selection and Configuration display (FIG.3) for the configuration of an entirely new unit to be added to the existing unit; and 3) the Design option 38 described below.

The Design option 38 in the SC allows the user to add component units 30 that can be mulled 34 to the existing components. As an example, if the user wants to add a round top to an existing rectangular unit 30, the Design option 38 will list all units 30 that are available. The user chooses "Add Round Top" from the list and the system will add the nearest sized round top to the existing unit 30 while simultaneously matching all other relevant attributes. If a new component unit 30 is added which contains attributes not applicable to the base unit 30, the system will present the user with only those questions 10 specifically applicable to the new component and which require the user's response. The Mull option allows the user to verify that mulling of two or more units 30 can be done. Notification of shop, Field or Invalid mull (depending on the units 30 that have been selected) will be presented to the user with a pop-up or "soft" warning display.

Figure 10:
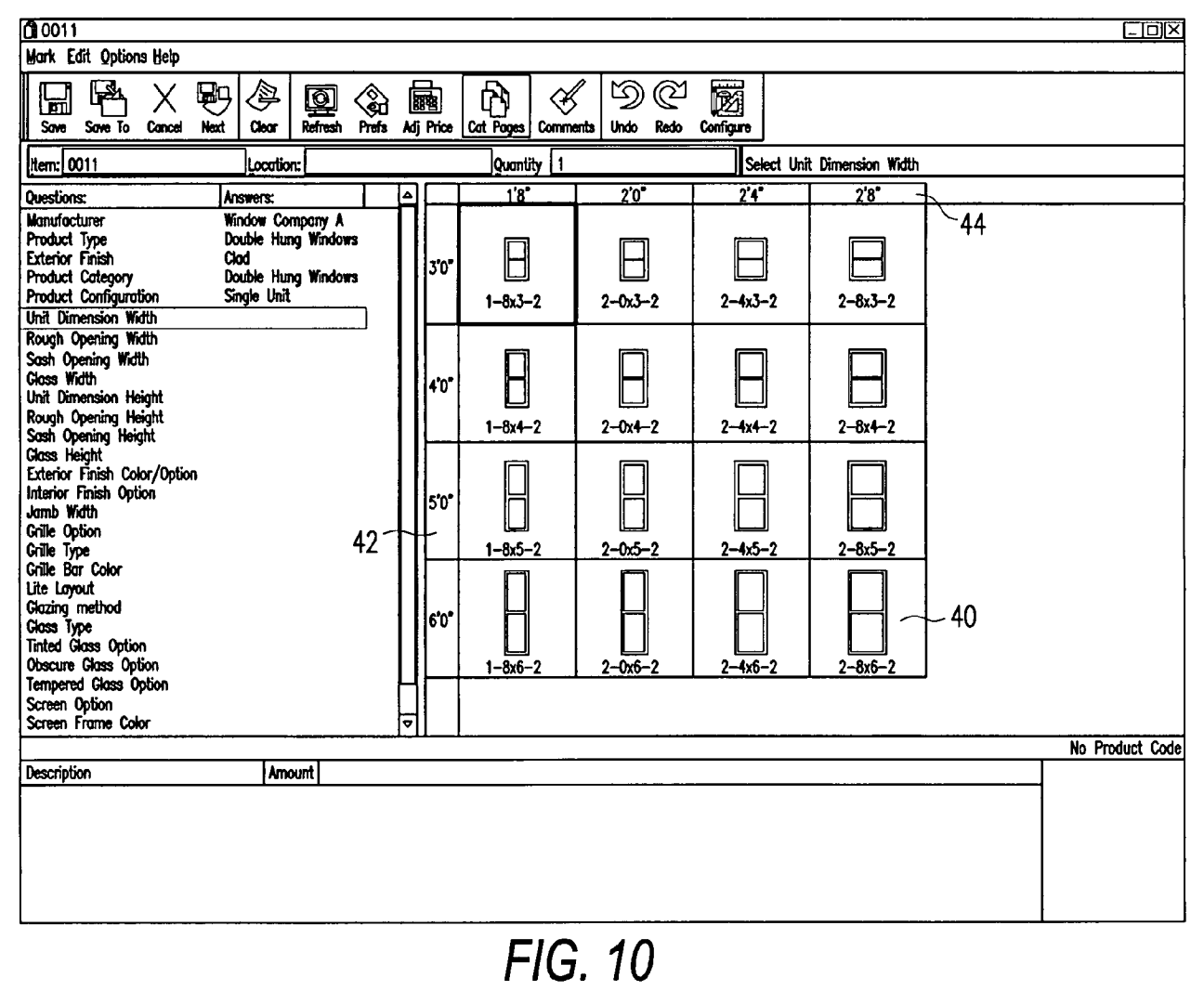

Referring now to FIG.10, this exemplary embodiment of the invention can incorporate a Catalog Page feature. The Catalog Page feature displays dimensional attributes whose ranges can be shown in tabular form. Its format is derived from printed product information sources that display such dimensional variables. Catalog Page Drawings 40 provide the user with graphic parametric representations using the widths and heights of the class of products being selected. Unit heights 42 will be displayed down the side of the selection box and the widths 44 will be across the top of the array. This feature clarifies dimensional information presented in text form and provides visual feedback with respect to the scale and size of selected products.

Figure 11:
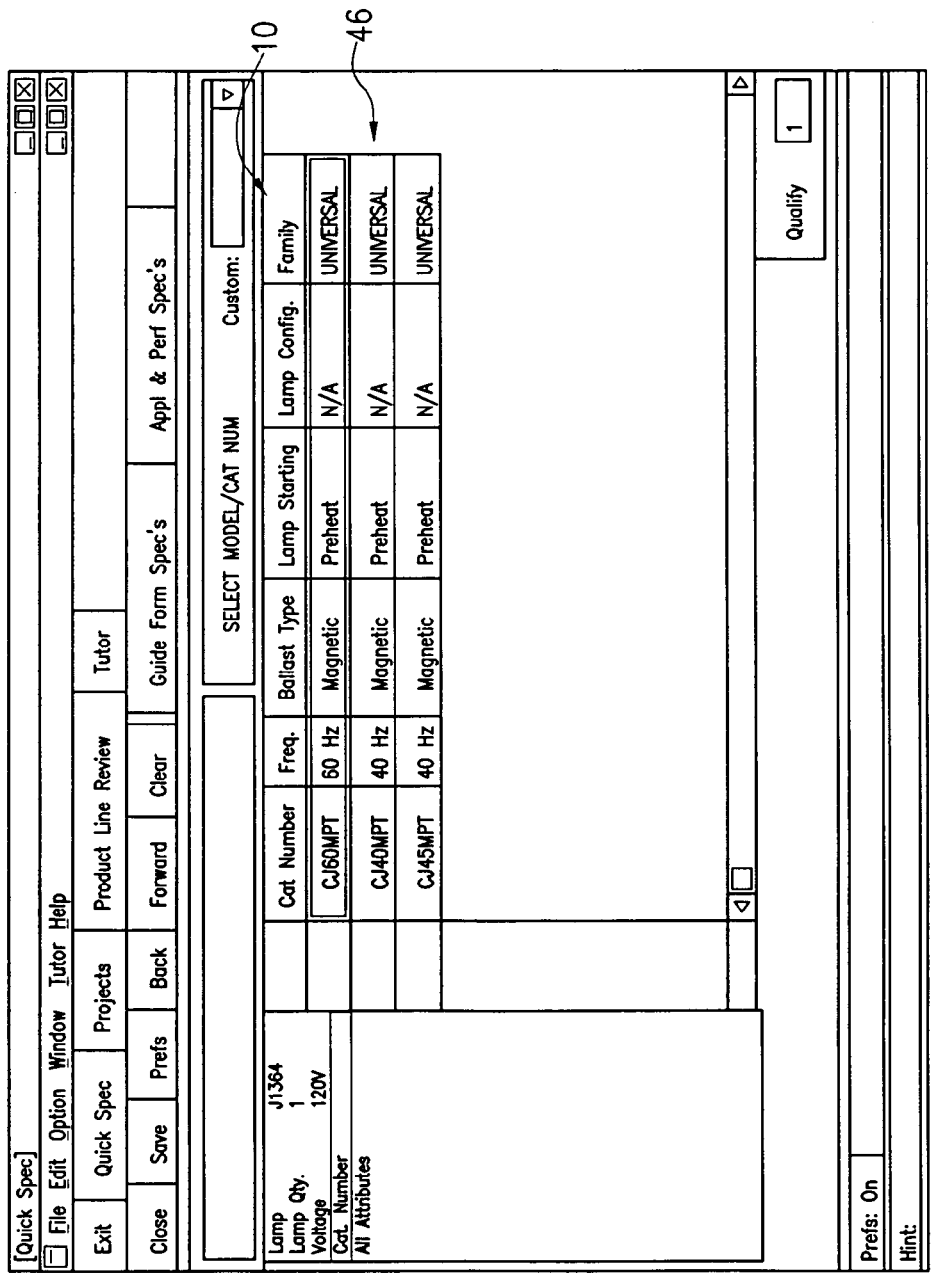
FIG. 11 is an exemplary illustration of a DataGrid display in accordance with a preferred embodiment of the invention.

Referring to FIG. 11, product information can be displayed in a DataGrid. The DataGrid is a tool that allows the user to view a table of answers 10 for a list of questions 12. Similar in form to catalog pages, DataGrids reflect tabular displays of product attributes found in printed catalogs and price books. In this view the questions 12 are presented across the top of the DataGrid instead of down the left hand side of the page. The DataGrid is useful where product questions 10 and answers 12 have a one-to-one correspondence.

Figure 12:
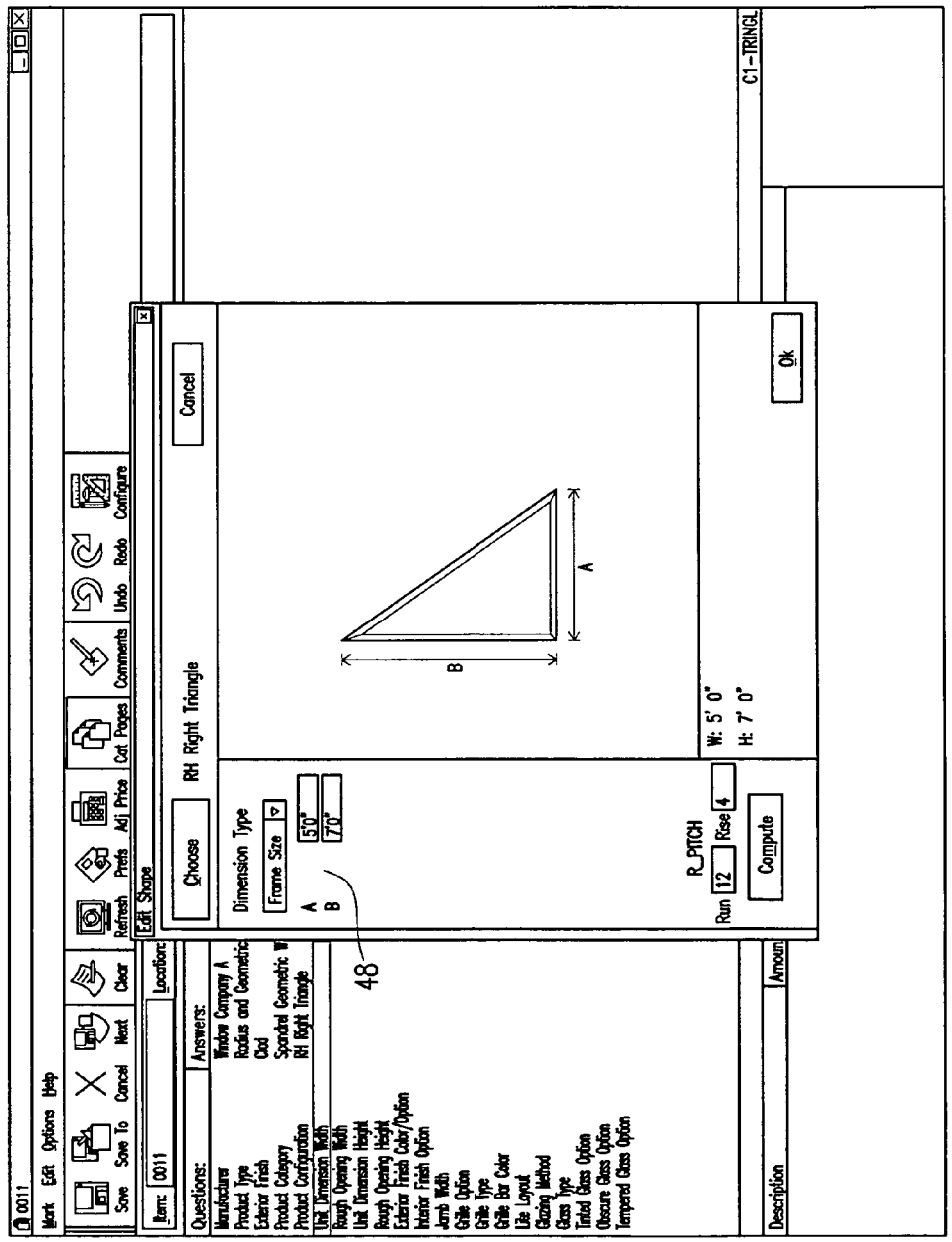
FIG. 12 is an exemplary illustration of a Custom Shapes Editor display in accordance with a preferred embodiment of the invention.

Referring to FIG. 12, a Custom Shapes Editor allows the user to size custom shaped products. The example shown in FIG. 10 directly applies to windows and doors, but may apply to any customizable product. The Editor is automatically opened when a custom shape product is selected as a product category. The Custom Shapes Editor is generally used in conjunction with Catalog Pages to select the general product shape (see FIG. 10) and permits the user to select and specify any combination of dimensional parameters 48 within the engineering limits set by the manufacturer. The Editor also displays a parametric representation of the custom product for inclusion on quotations. All pricing formulas relating to, for example, glass size, glass area, grille patterns and types, frame side lengths, and other parameters 48, can be driven with the Custom Shapes Editor.

Figure 13:
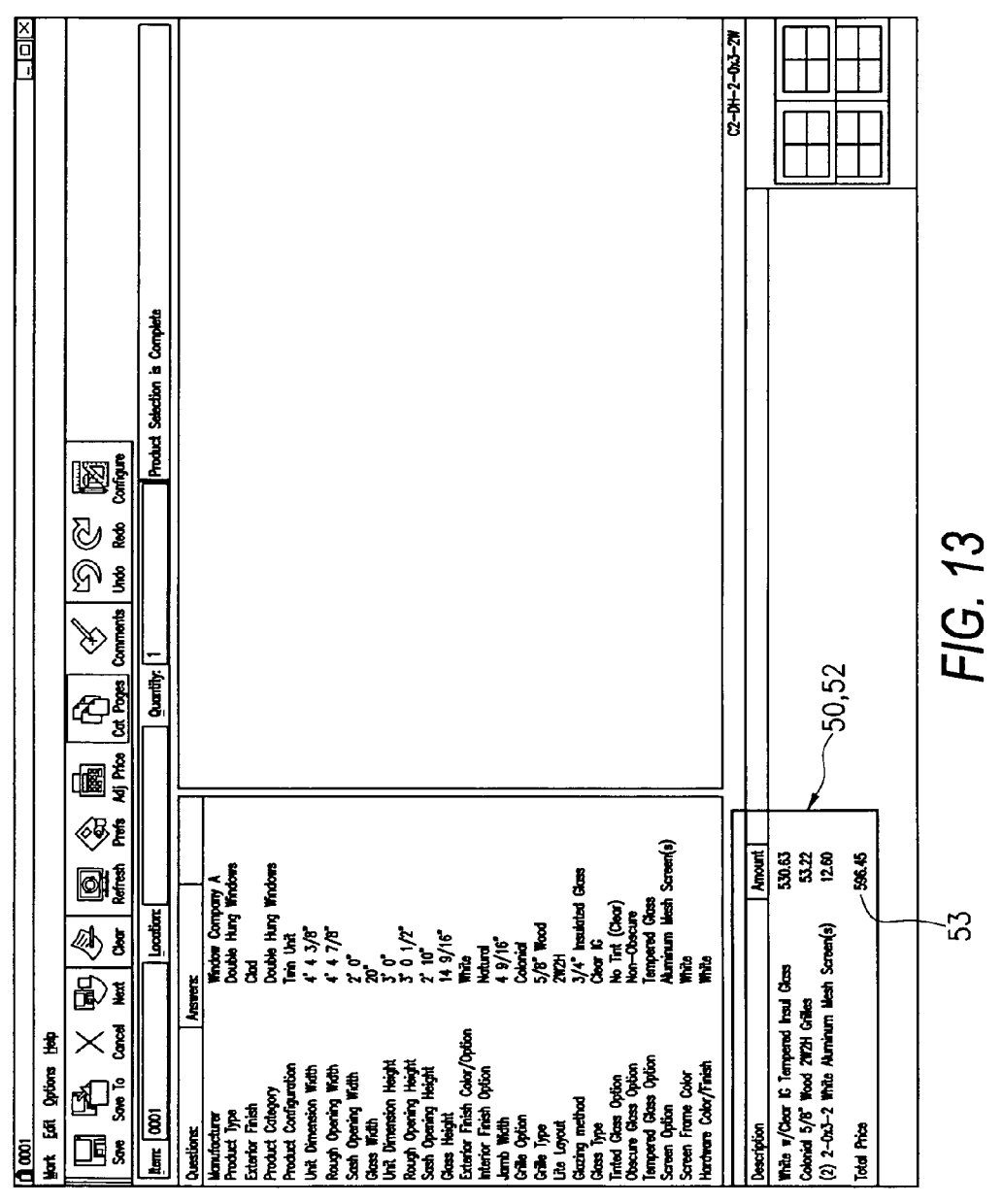

Referring to FIG. 13, this exemplary embodiment of the invention utilizes data tables and formulas to look up, calculate and store base prices 50 plus add-on prices 52 of available product options. The total price 53 can include project-based price adjustments if applicable. Pricing of products utilizes a combination of values accessed from a table and enhanced by formulas, which calculate up charges, add-ons and other product options. These methodologies allow the lookup, calculation and storage of unit base prices 50 plus prices 52 for all applicable product features and add-ons. Project-based price adjustments are also available for customer discounts, promotions and competitive bidding situations.

Figure 3:
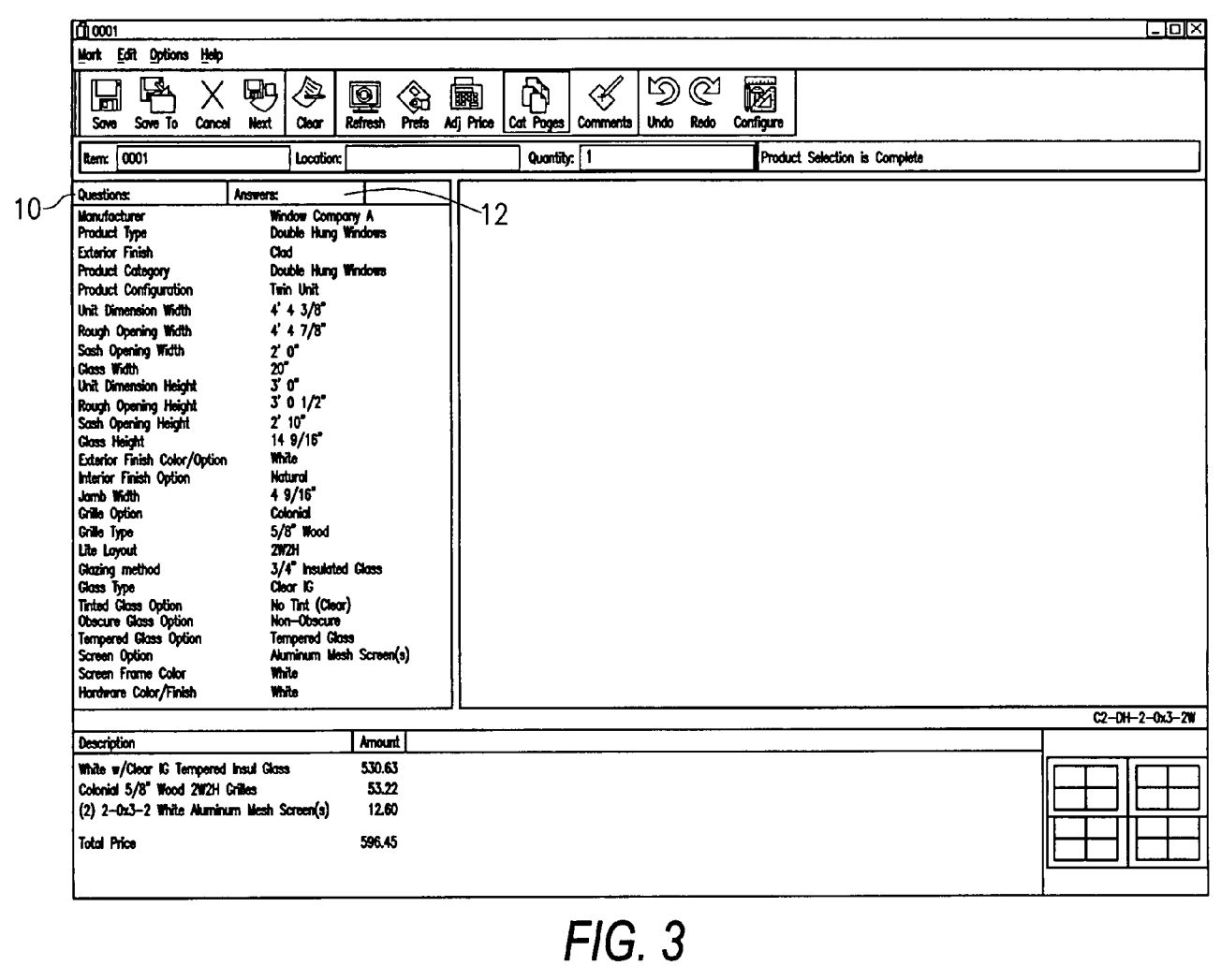
Figure 14:
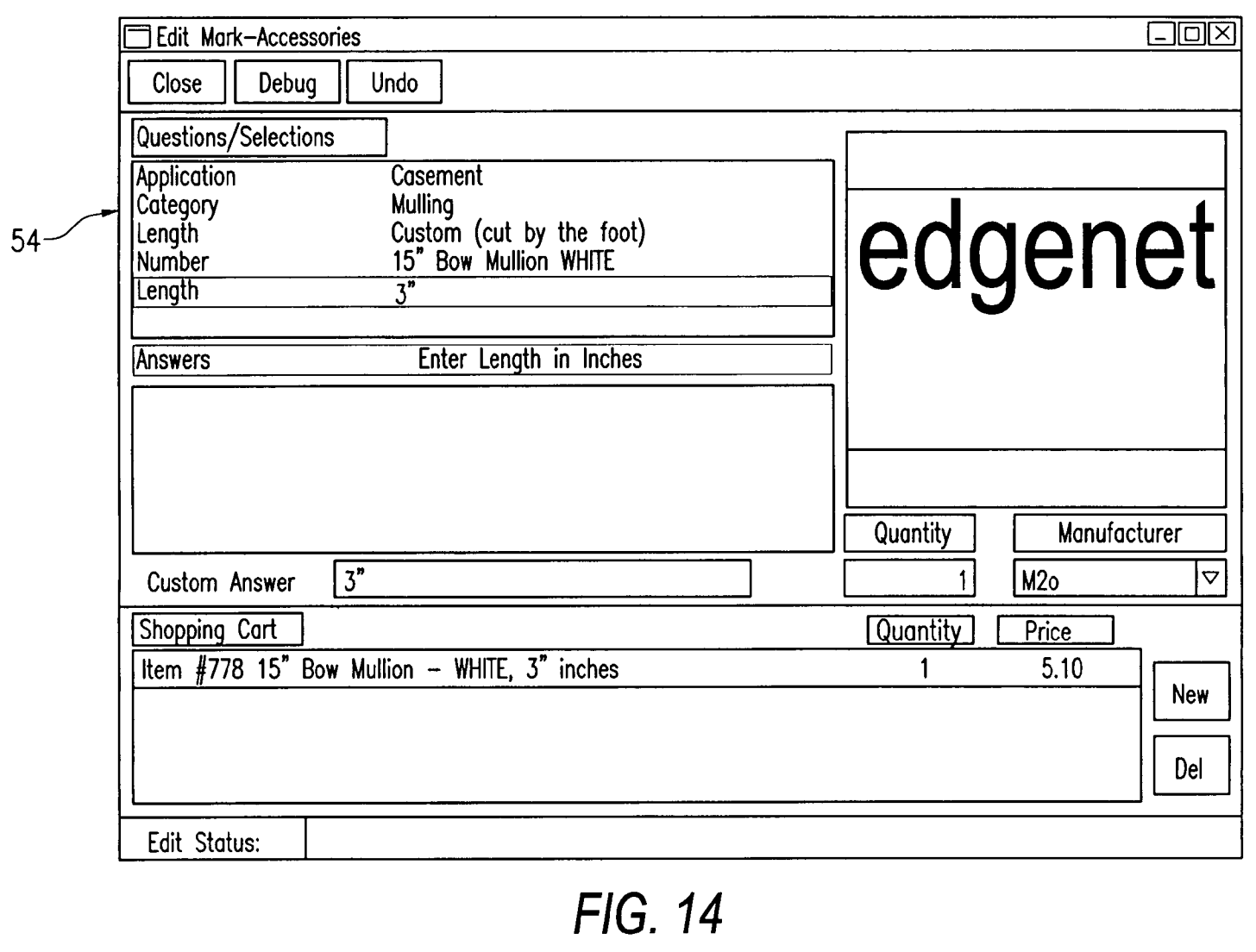

Referring to FIG. 14, an accessories module may be added containing product accessories 54 supplied by the manufacturer in conjunction with its primary products. The accessories module can include lineal products (e.g., extension jambs, molding, mull covers, etc.) as well as individual or boxed parts and components (handles, hinges, operators, etc.). This module can also be used to add accessories 54 to a quote that are purchased from other sources. Such additional items are added by entering text descriptions in a text box along with the prices for such items. All accessories 54 entered through the module appear on the quote as individual line items. Functionality can also be included to price accessories that are configurable (i.e., items which are defined by attributes displayed and represented in the Selection and Configuration display (FIG. 3). These accessories or replacement items require product knowledge description and definition similar to primary products and present the user with relevant questions and answers as already described.

Figure 15:
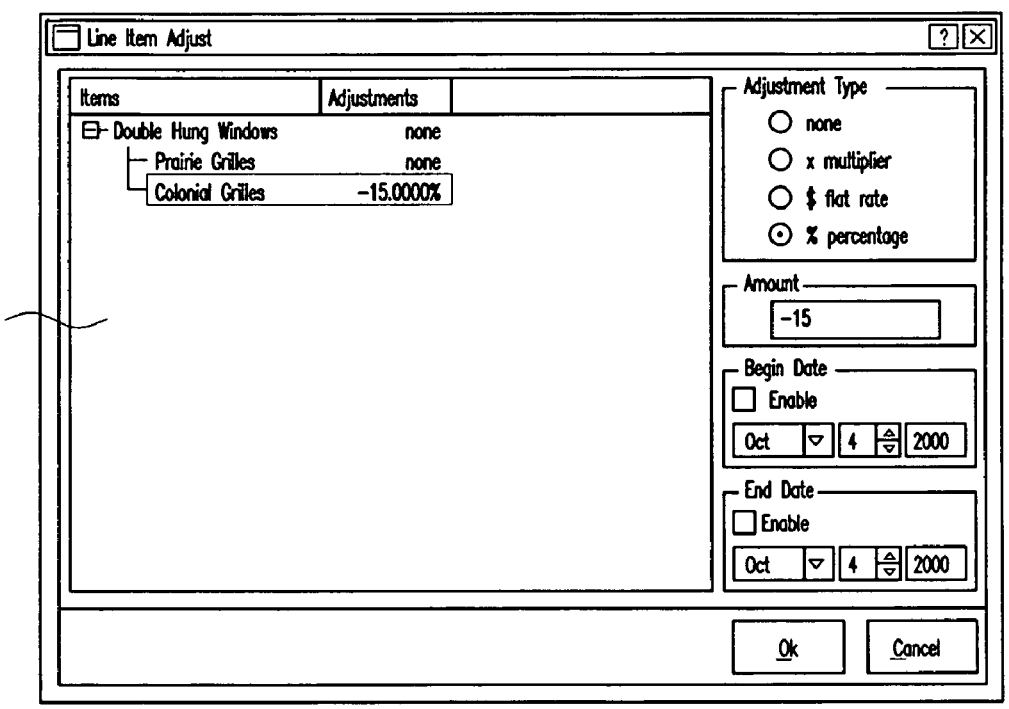
FIG. 15 is an exemplary illustration of a Line Item Adjust Module in accordance with a preferred embodiment of the invention.

Referring to FIG. 15, this exemplary embodiment of the invention provides a function to enable line item discounting for products, product lines and related attributes. Line item discounting can be applied to specific configured units; specific attributes (e.g., screens, grilles, etc.) or configured composite units. All of the line items for which discounting is available are displayed in the Line Item Adjust Box 56 lists. The Line Item Adjust box lists all applicable items, and price adjustment may be applied as follows: 1) none; 2) by multiplier; 3) by a flat fee; or 4) percentage (%). Using the price adjust function, additional price adjustments can be applied to specific clients, individual units within a project, individual projects, or to groups of projects.

Referring to FIG. 16, this exemplary embodiment of the invention enables production of a variety of outputs, one of which can be an order form as shown. The client manufacturer can derive the format, content and design of the order form from an existing form in use. Order forms can contain all codes 26 necessary to build a specified product as well as pricing and dealer/distributor information. The order form is a tabular view of the information needed to build the set of products defined by a particular project. Also included is an "electronic order form" mechanism through which comma or tab delimited ASCII files can be created and exported. These files can be imported by other applications and may be designed to meet the needs of each manufacturer.

Referring to FIG. 17, this exemplary embodiment of the invention enables the production of quotes, which include scaled elevation drawings of the product, reflecting the parametric drawings 28 generated during product selection and the use of the Schematic Configurator module. Also included is a list of all options chosen, the unit base price 50, add-on prices 52 for non-standard choices, total price 53 for each product, and a grand total 60 of all products in the project.

Referring to FIG. 18, this exemplary embodiment of the invention can provide a Schedule Generator. The Schedule Generator can build a product schedule 62, listing all products included in a project, and relevant attributes assigned to each product, plus the system assigned product code 26. The Schedule 62 is constructed as products are selected and constitutes a valuable tool for use by sales people as well as design and construction professionals, providing a full view of the products to be used in a construction project. When an attribute of any unit 30 is changed, the change is reflected on the Schedule 62 as well. The Schedule 62 can be displayed on-screen or printed as hard copy.

Referring to FIG. 19, the exemplary embodiment of the invention enables generation of product specifications 64. After a product has been configured and the user requests a technical specification 64 for that product, the Specification Generator gathers all relevant product information and produces a valid proprietary specification which conforms to the Construction Specifications Institute (CSI) three part section format. The Specification Generator works from content-complete template specifications supplied by the manufacturer. The system can produce unique customized specifications 64 for each product in a project or (as an additional option) a single specification 64 for multiple products.

Figure 20A:
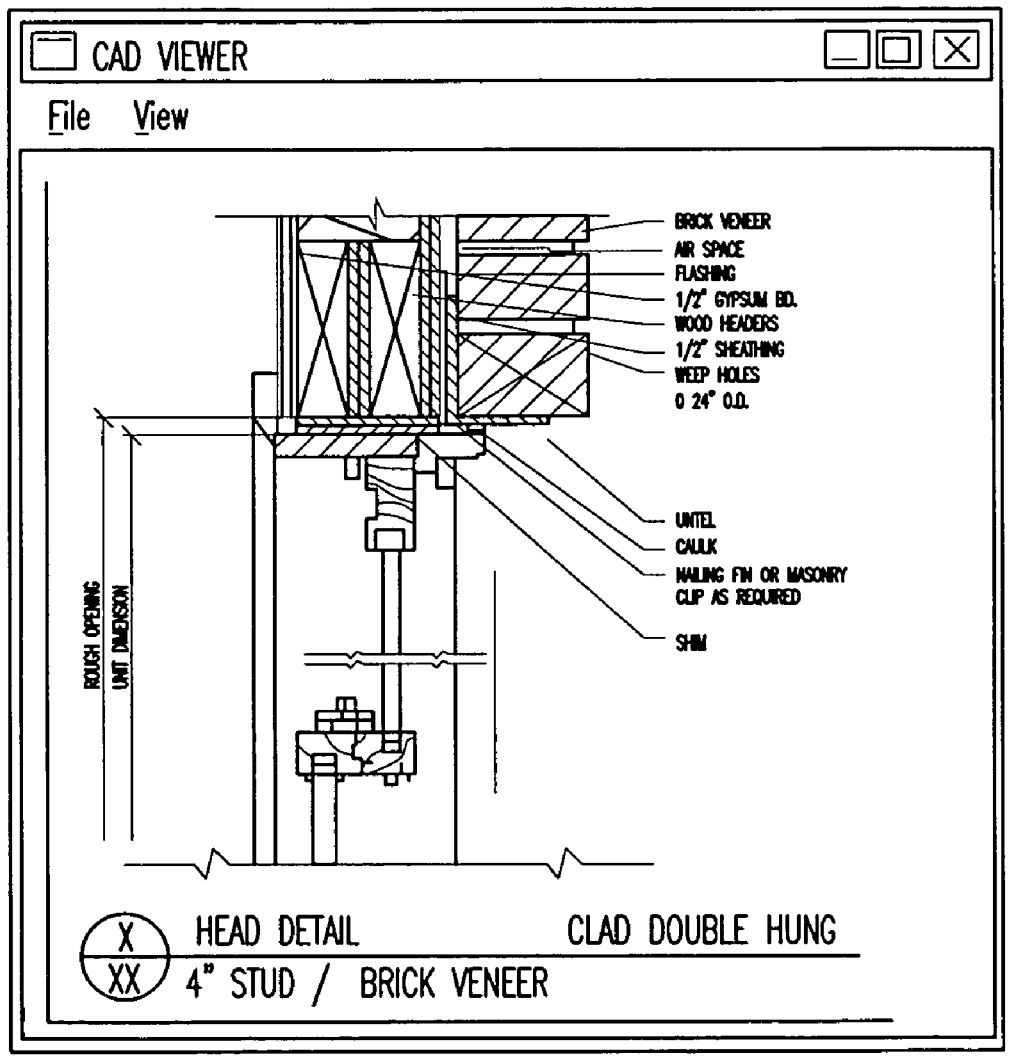
FIG. 20 is an exemplary illustration of an AutoCAD display in accordance with a preferred embodiment of the invention.
Figure 20B:
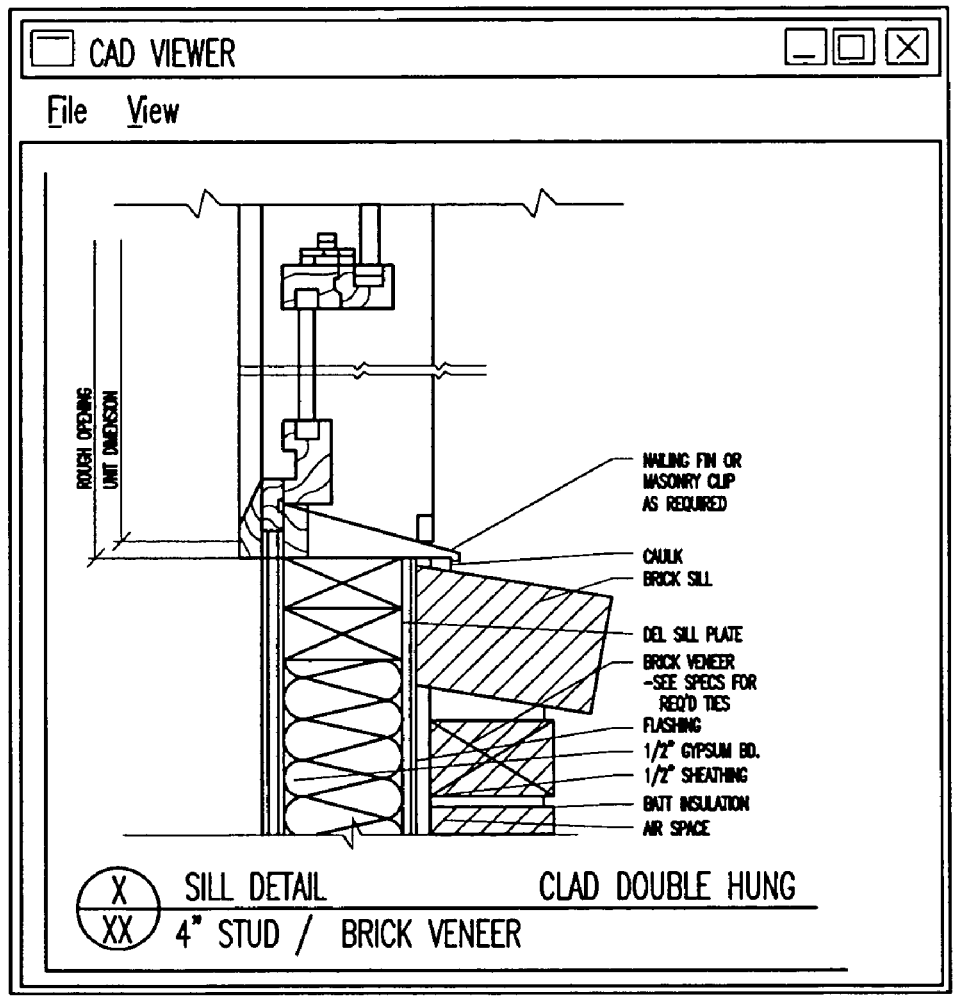
Figure 20C:
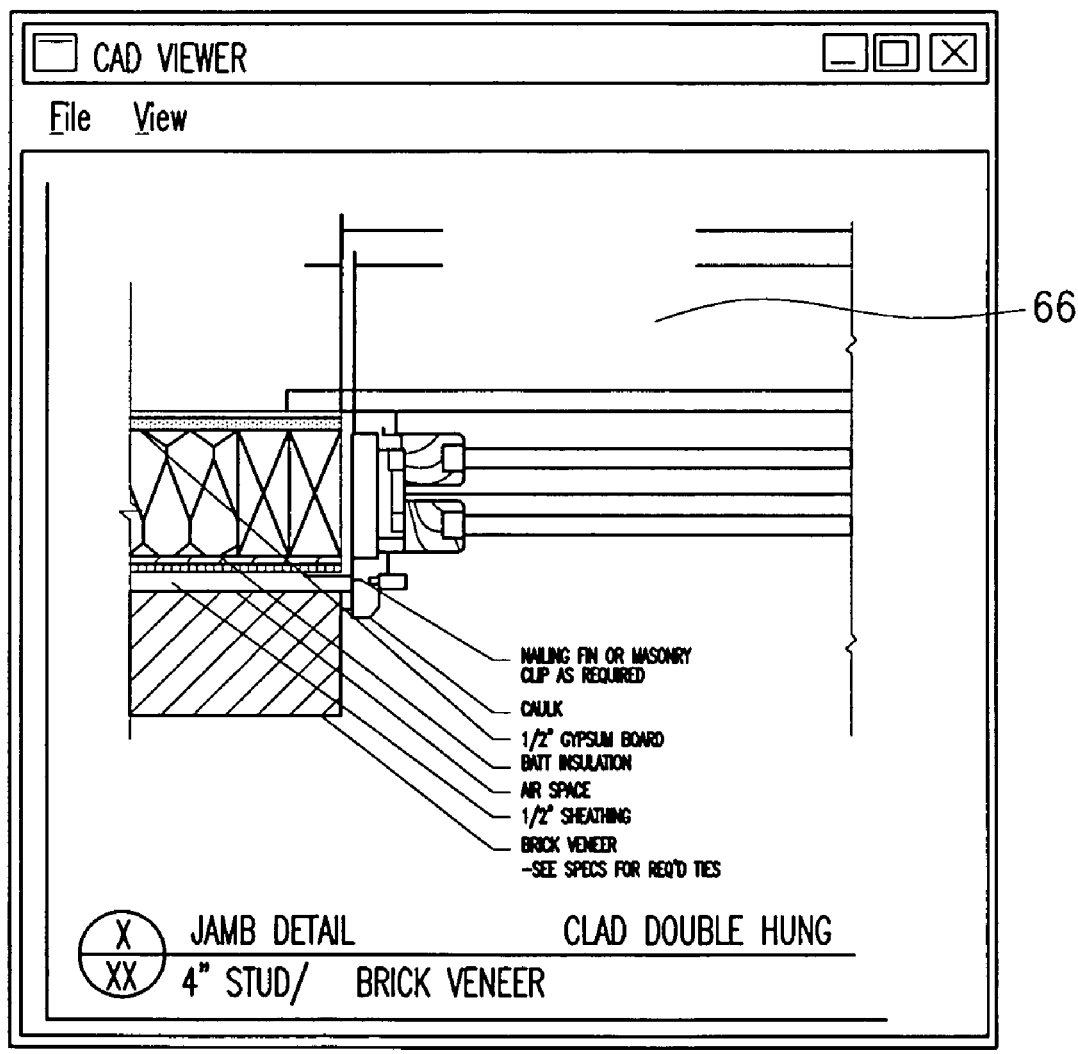

Referring to FIG. 20, this exemplary embodiment of the invention allows the user to view, print, copy, and export AutoCAD drawing files as DXF files, compatible with a number of CAD systems under the Windows environment. This embodiment of the invention has the ability to do multi-layered component assembly of DWG files. Component assembly is the process of displaying several DWG files at once, which overlay one another to compose an entire detail. The image 66 displayed as a section detail is actually made from three to five separate sub-assembly drawings, and several cross section details can be displayed simultaneously. The drawings included are based on the attributes selected during product selection and configuration. The system can export DWG files to a DXF formatted file. This feature allows the editing of exported drawings using a CAD system that accepts DXF files. The system also will allow the user to print drawing details.

Figure 21A:
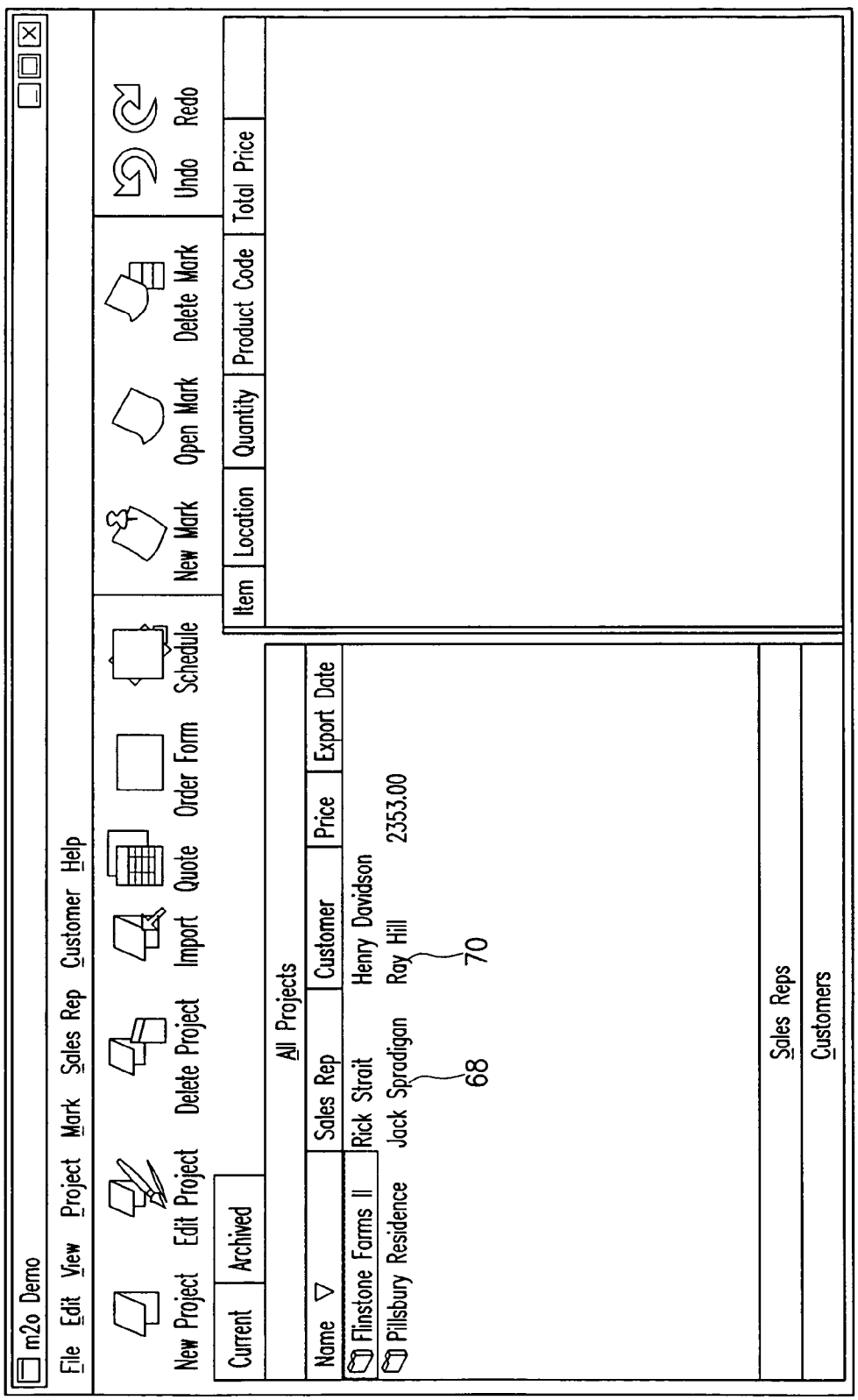
Figure 21B:
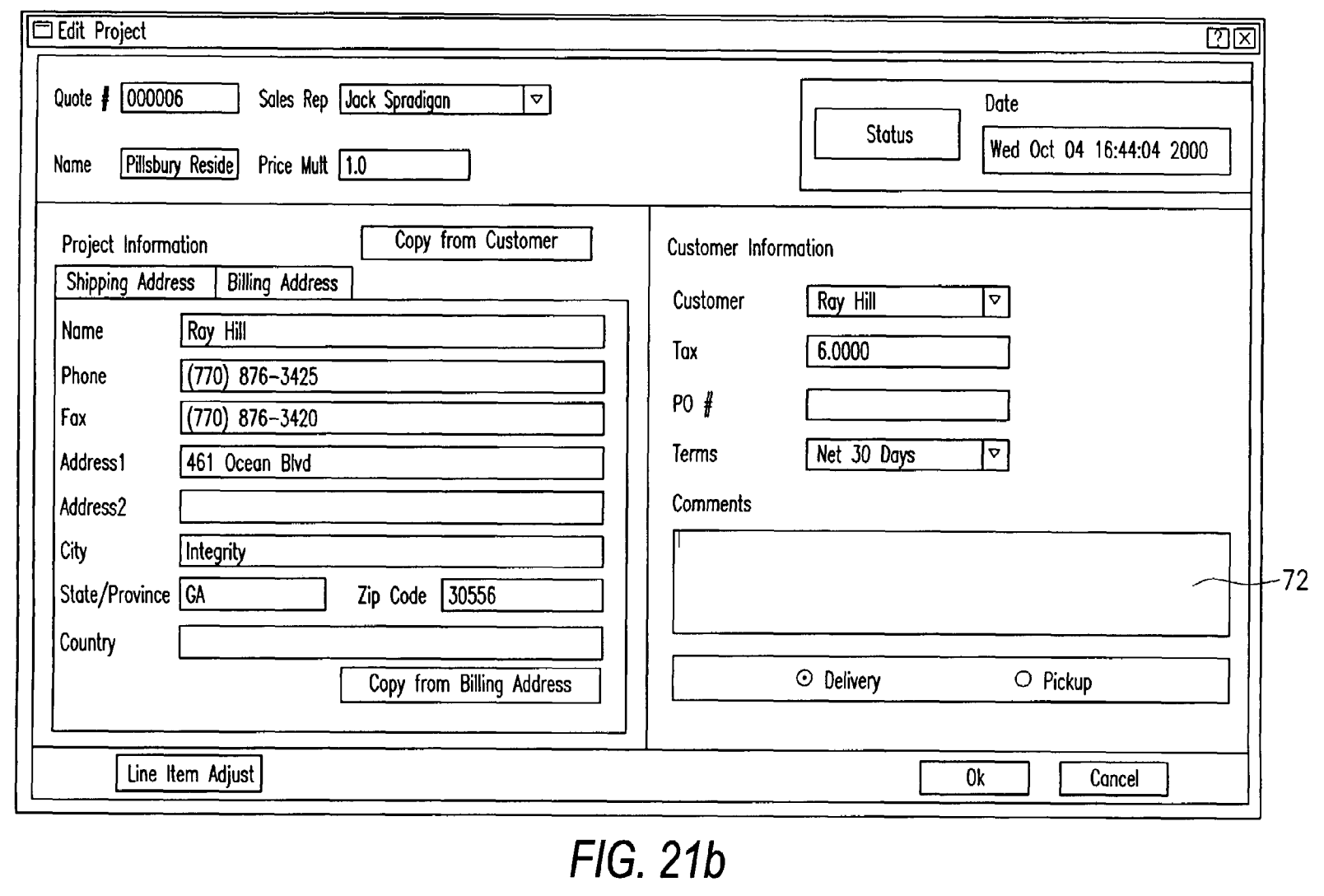

Referring to FIGS. 21a and 21b, this exemplary embodiment can include a project database, which maintains and tracks information that is unique to a particular project. The project database contains the sales or customer service representative's name 68, relevant customer information 70 and project information 72 for that particular project. When a new project is created, information from associated databases for sales-representatives and customers is available through drop-down boxes. Fields for Terms of Payment, PO Number, Price Multiplier, and Project name are available, as well as the Line Item Adjust function (FIG. 15). Projects are categorized as Current or Archived and can be moved between these categories as necessary. When a Project is highlighted in the Project window, all units in that project are displayed. Interfaces to contact management systems, sales systems and sales force automation systems can also be engineered on request. The system allows for record additions, changes to existing records, deletion of records, and duplication of records.

Figure 22A:
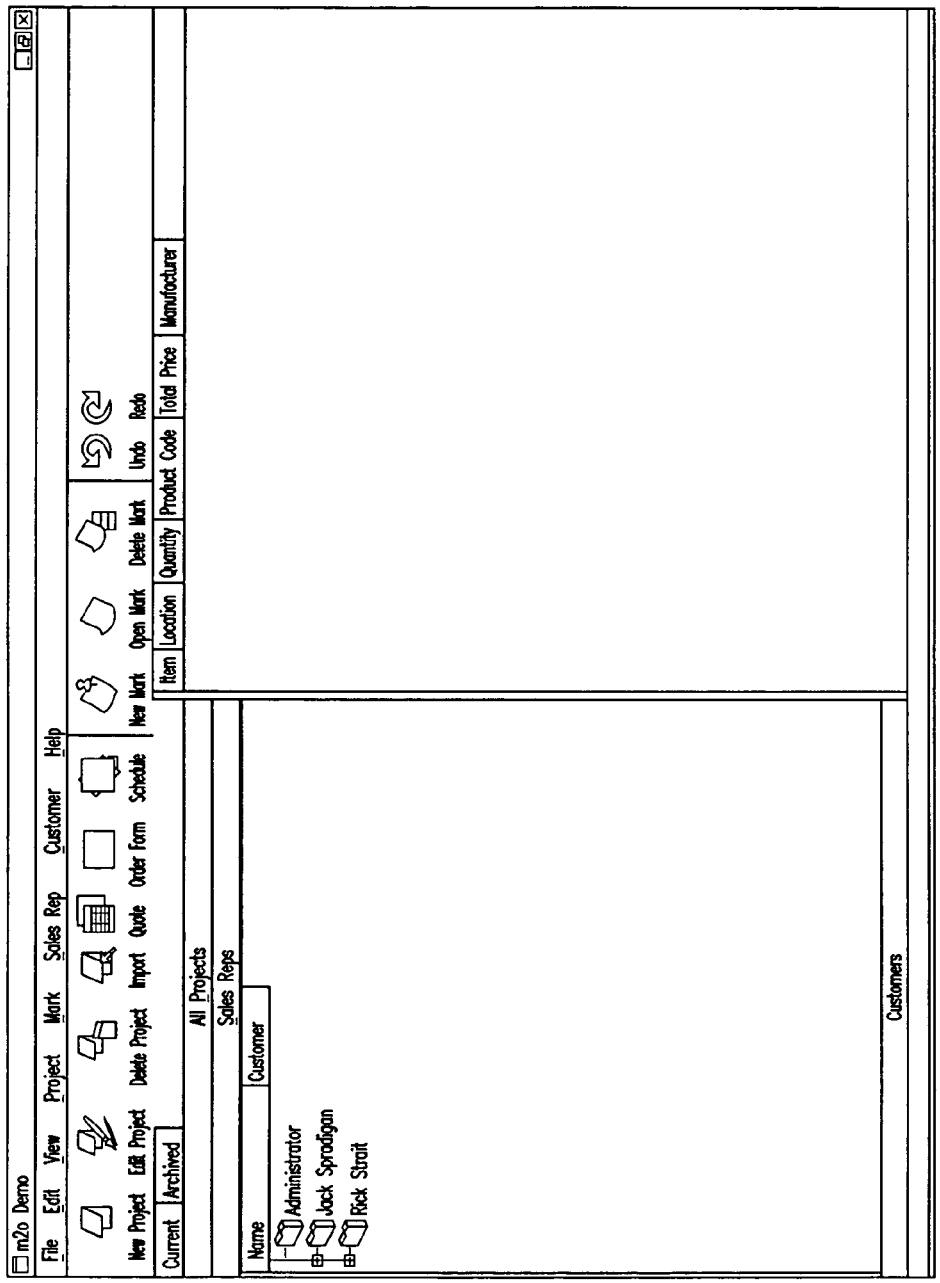
Figure 22B:
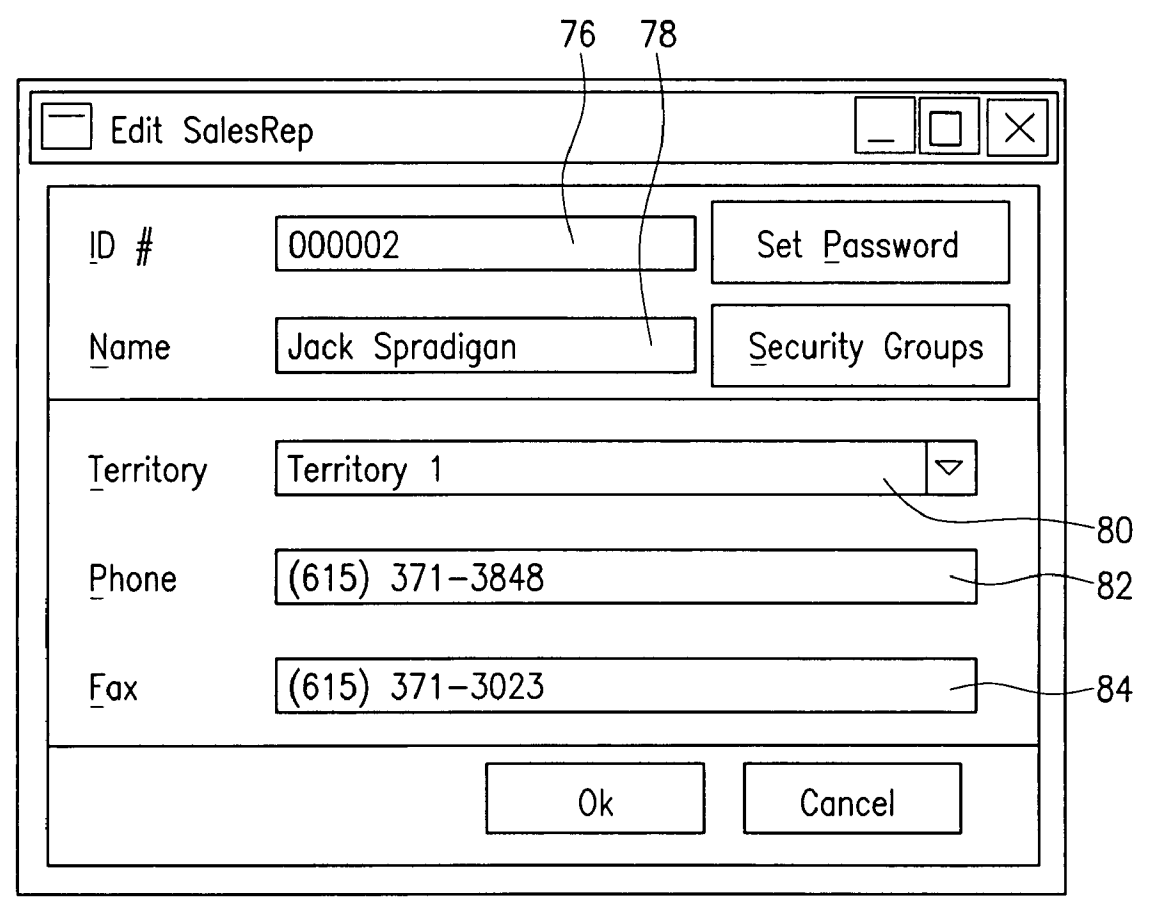

Referring to FIGS. 22a and 22b, the system can also include a Sales-Representative database, which controls all information for sales-representatives. These items are ID# 76, Name 78, Territory 80, phone number 82 and fax number 84. The system allows for record additions, changes to existing records, deletion of records, and duplication of records. The Customer list for each sales-representative can be viewed by selecting a specific sales-representative name in the listing.

Figure 23A:
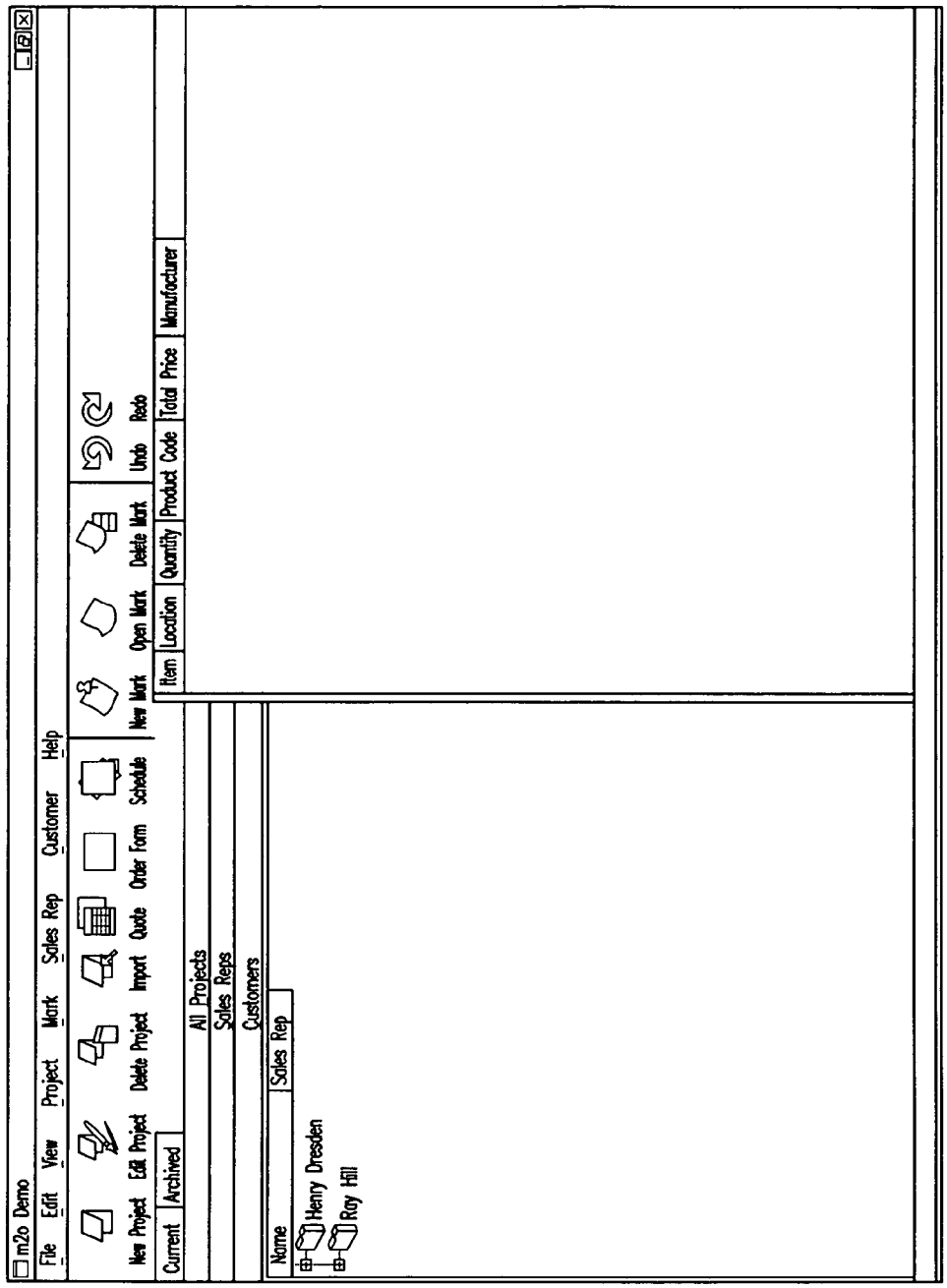
Figure 23B:
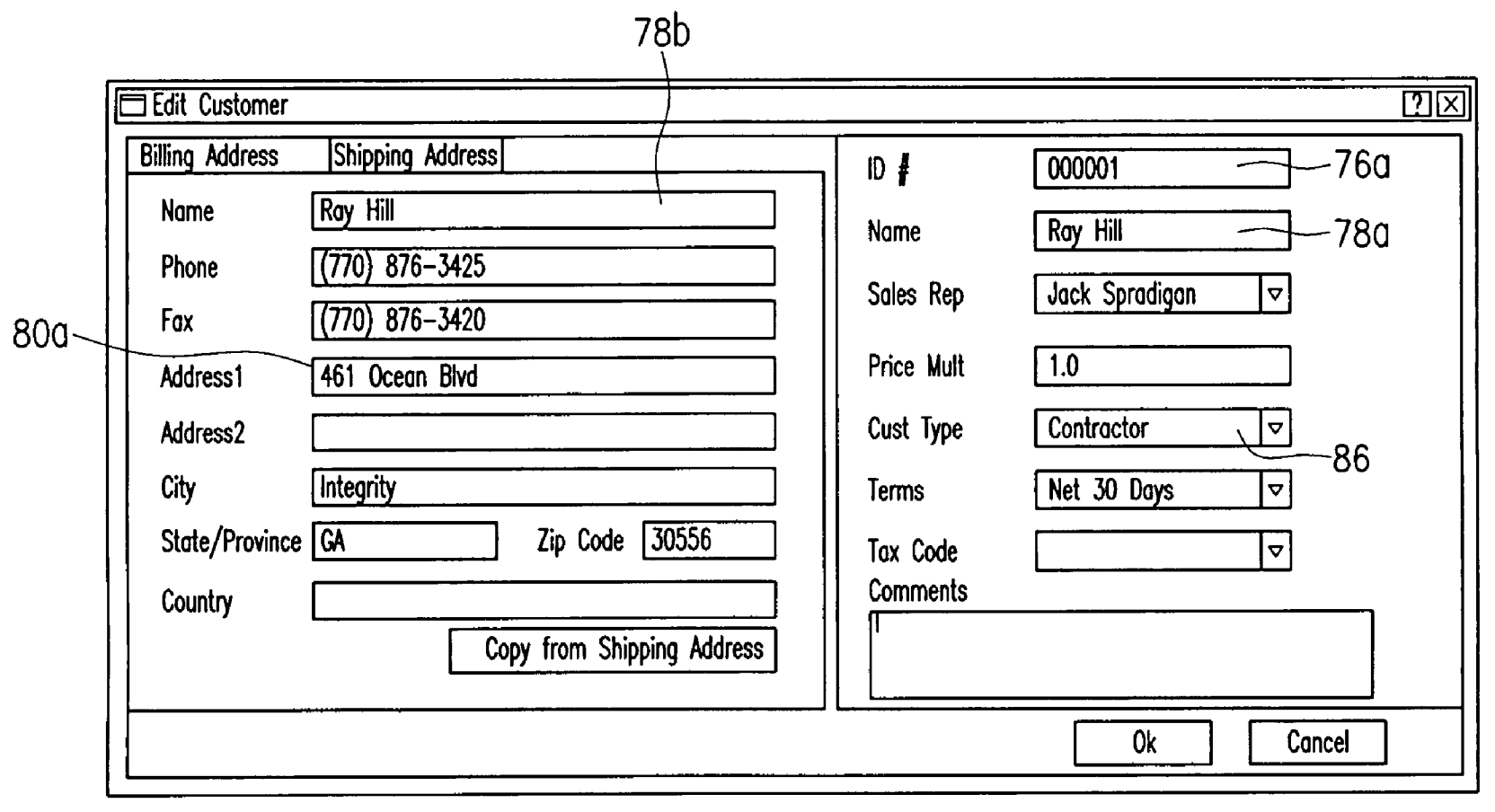

Referring to Figs. 23a and 23b, this exemplary embodiment of the invention can also include a Customer database to control all information for customers. These items are ID# 76a, Name 78a, separate billing 80a and shipping Addresses, Contact name 78b, Customer type 86, and miscellaneous defaults. The system allows for record additions, changes to existing records, deletion of records and duplication of records. Customers are displayed in a listing which includes the sales-representative for each customer.

This exemplary embodiment of the invention can also include an Import/Export function set which permits a project to be built on one computer and exported into a file format, which can be imported into the same application on another computer (provided the product knowledge sets are exactly the same). This function set allows a project to be constructed by a customer and then imported by a dealer, distributor or sales representative for quote generation, final order pricing adjustment and negotiation. Similarly, projects can be shared between dealers, sales-people and customer service personnel.

This exemplary embodiment of the invention also includes a System Help File. The System Help File can offer an on-line condensed version of the full user documentation typically supplied with the system. The System Help File can provide easily accessible information to assist in the operation of the system. The System Help File can be configured to be context-sensitive so that the Help topics available are driven by the user's position in the system.

Figure 24:
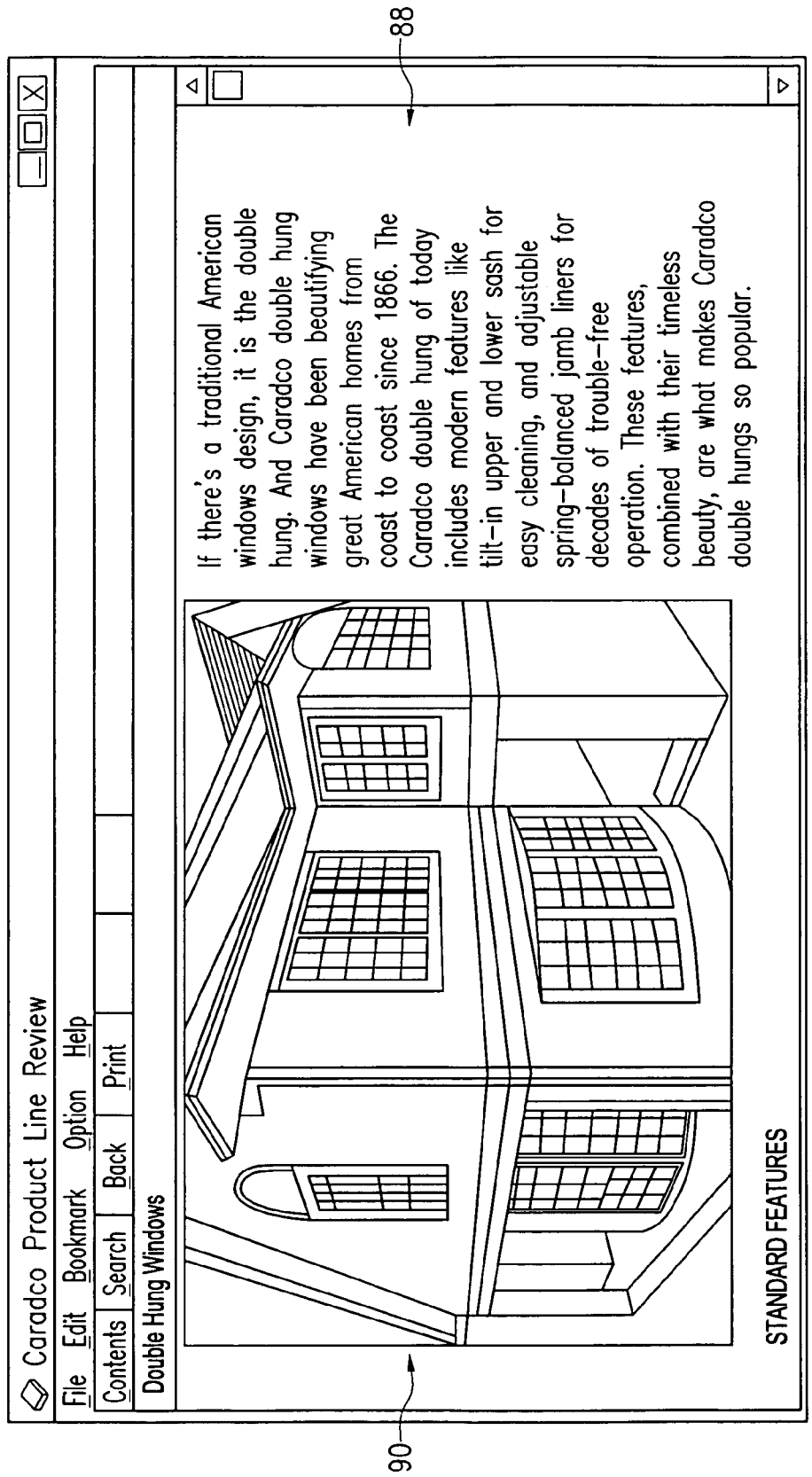
FIG. 24 is an exemplary illustration of a Product Line Review display in accordance with a preferred embodiment of the invention.

Referring to FIG. 24, this exemplary embodiment of the invention can include a Product Line Review function. The Product Line Review offers manufacturer and product line information 88, as well as general industry information 88, as it relates to the manufacturer's product line. Product Line Review is typically derived from each manufacturer's sales and marketing catalog(s), promotional brochures and other printed materials. Product Line Review can include full color or black & white scanned images 90, product features and benefits (as text descriptions), line drawings, technical illustrations and other appropriate product information.

Figure 25:
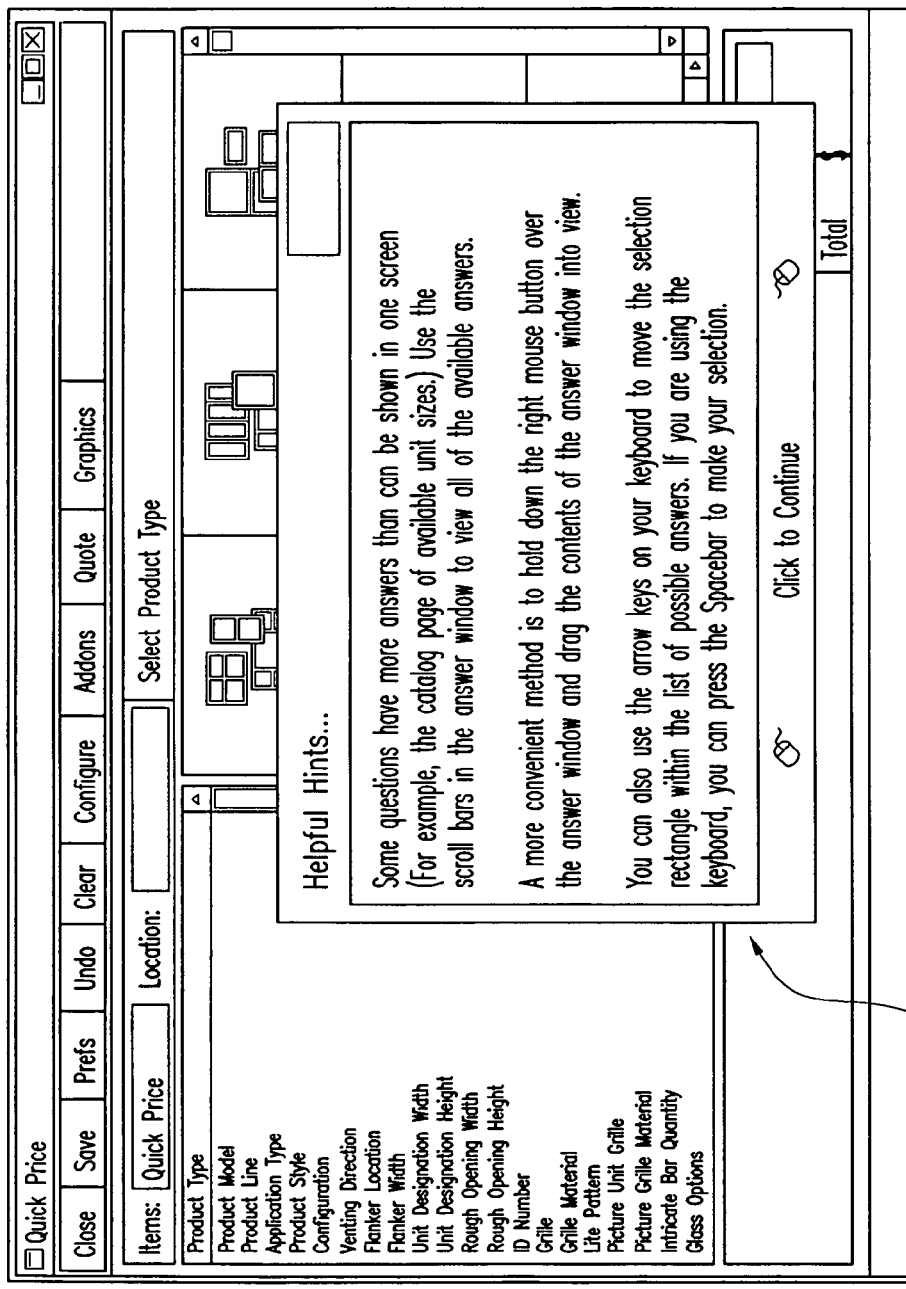
FIG. 25 is an exemplary illustration of an Interactive Tutor display in accordance with a preferred embodiment of the invention.

Referring to FIG. 25, this exemplary embodiment of the invention can incorporate an Interactive Tutor. The Interactive Tutor is a series of help screens 92 referenced to specific system features and functions. When the Show Messages (or Tutor) option is checked, the system will present messages on the screen to assist the user with the next step. This option is turned on or off by either selecting the Tutor button or by opening the Tutor Menu and clicking Show Messages so that the check is removed.

Audio/Visual Presentations can also be included as an integral part of the exemplary system. Sound, video or both media combined can be utilized to present, promote or enhance the client company and its products. Examples of this kind of information include videos of manufacturing processes, product installation procedures, or sales and marketing presentations. Audio information can include theme music or sound tracks, which complement video information.

This exemplary embodiment of the invention can also include a Product Information Module. The Product Information module allows the user to view various catalogs as a product is specified. Combining the expert system with the Adobe Acrobat Reader, for example, allows users access to a range of supporting product information. The printed catalogs from which this information is derived are more graphically oriented than CAD drawings and specifications. Generally, the format of this kind of material is PDF files.

Figure 26:
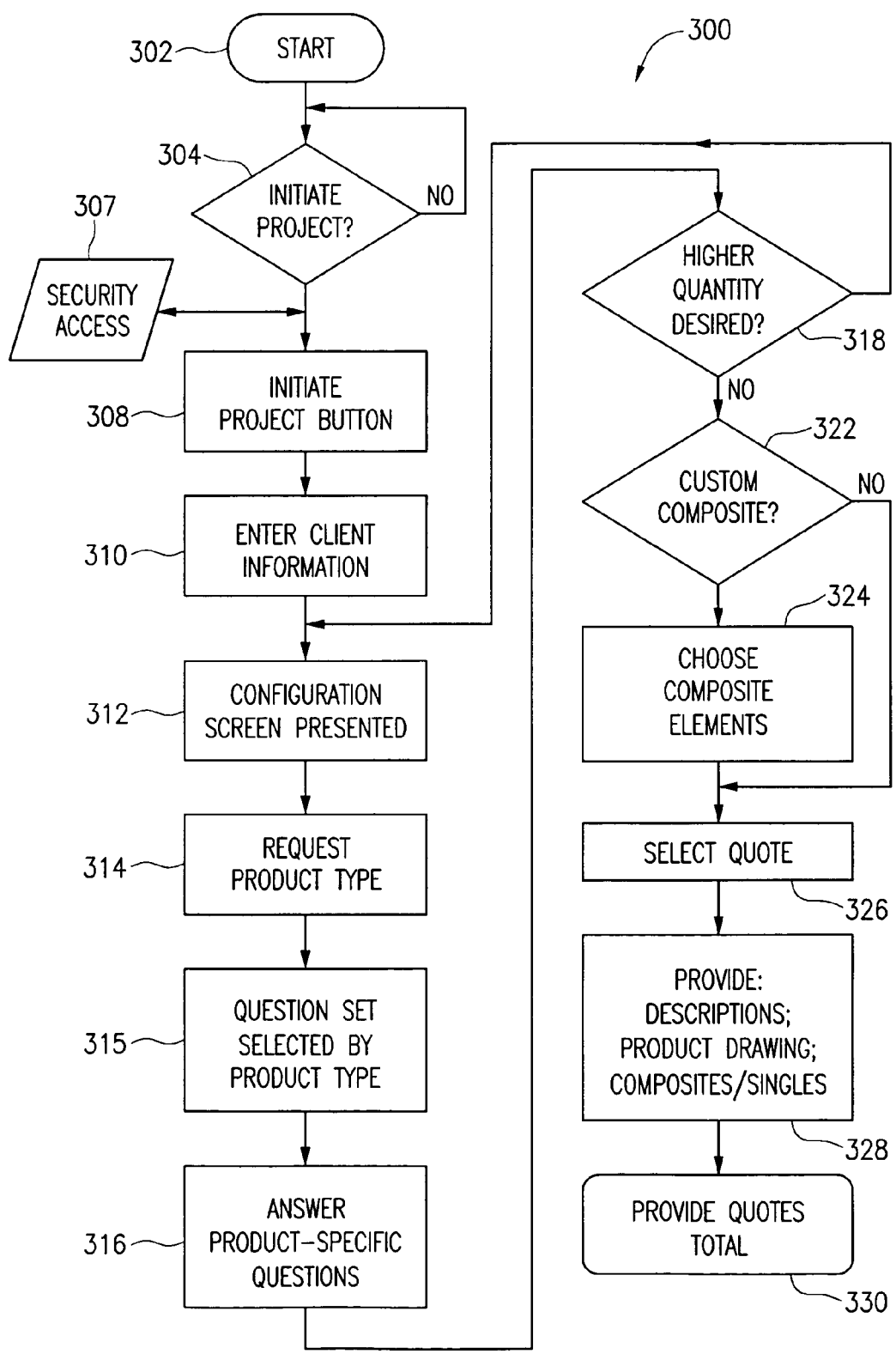
FIG. 26 is a flow diagram illustrating the sales/personnel process flow steps in accordance with a preferred embodiment of the invention.

Referring now to FIG. 26, flow chart 300 illustrates how another exemplary implementation of a preferred embodiment of the invention can be employed by a sales-representative/user in ordering sales for customers/users in the field. After the program is started at step 302, the sales-representative will call on new or existing customers to investigate prospective business. The sales representative can then run the system and start a project. At step 304, the representative would initiate the project and a list of all projects would be displayed. The representative can then initiate a new project at step 308. Alternatively, the system could remain in a "wait" mode until the project button is initiated. Once the project button is initiated, the sales-representative can then type in the client's name and address, and other pertinent information at step 310. Once the client information is entered then the user is presented with a configuration screen (step 312) that can be used to begin adding product information.

The manner in which a product is entered consists of the user inputting into the system a request for a new "mark." A "mark" refers to a configured unit or product such as a window, door, or other assembly. The user can then select a product type, such as a window, at step 314. The user can then begin to configure a new mark and at that point is prompted to answer some questions about the product at step 315 such as the type, size, or style of window desired. The sales-representative/user can input the specific product information, for example, color options, glass type, etc. At step 318, the sales-representative can select a quantity of product for the project. As a result, the system will repeat the same configuration for the number of windows entered in the Quantity data field.

At step 322, the user can create custom composite units. At this point, the user would enter the Schematic Configurator and choose the composite elements for the configurator to construct at step 324. Once the custom configuration is complete, or if the custom composite step is bypassed, the user can initiate a quote button at step 326, which enables the calculation of a price quote for the products currently defined by the project. The quote can contain individual descriptions of each product selected in preceding steps with all associated pricing, along with a drawing of each product with any custom composite units. Moreover, the information can be displayed, printed, presented or otherwise output together or separately at step 328. At step 330, the system would provide a price total and a total quote for the project.

Figure 27:
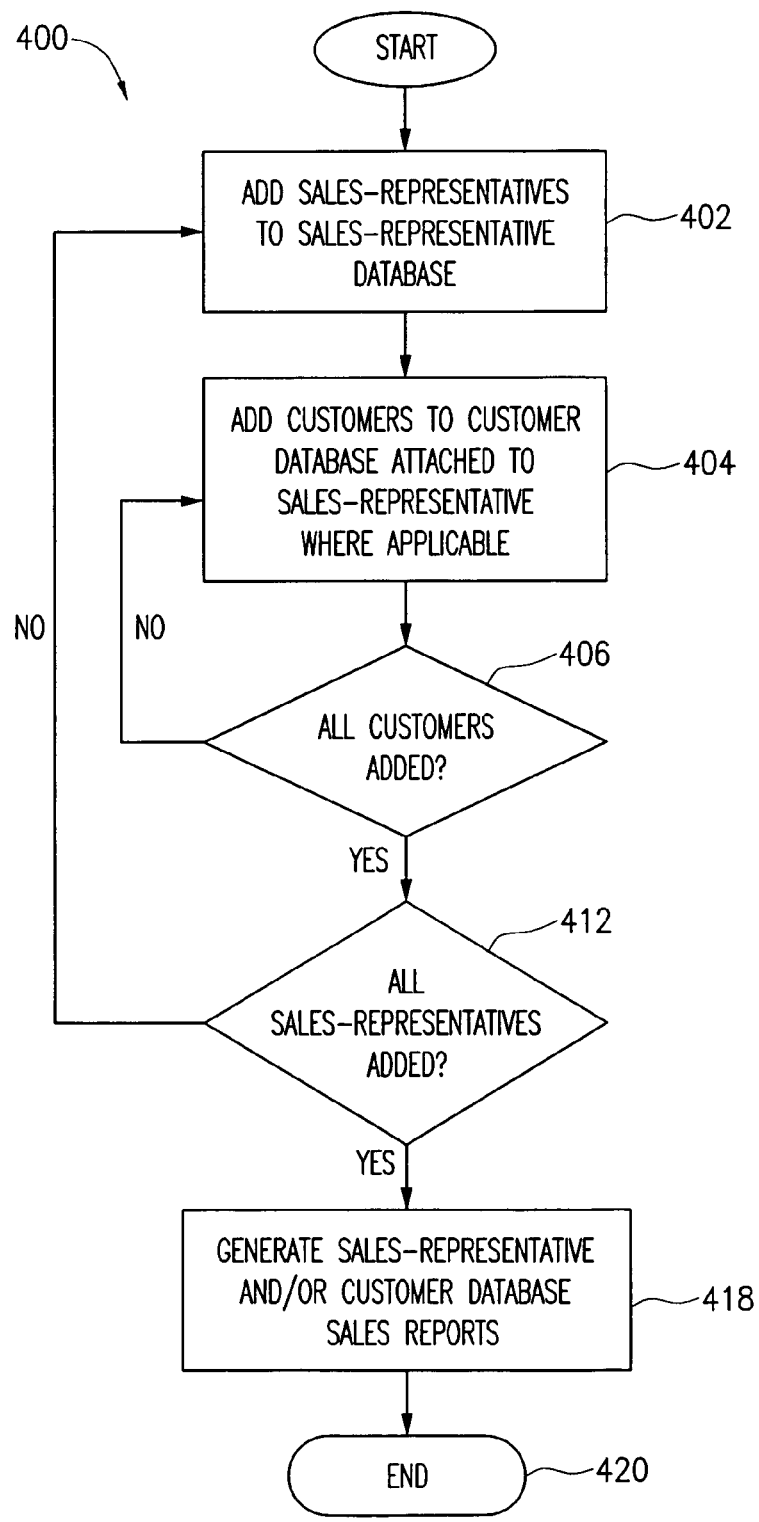
FIG. 27 is a flow diagram illustrating the dealer/distributor use steps in accordance with a preferred embodiment of the invention.

FIG. 27 illustrates another exemplary implementation of a preferred embodiment, in which a dealer distributor adds individual sales representatives to the database at step 402. Customer names will then be added at step 404. The system will then check whether all customers have been added at step 406. If not, then it will loop back to add more names. Once all customers have been added to the database, the system will query whether the same thing has been done for sales representatives at steps 412. Once this data has been added, then the system will generate the customer database sales report. Once completed, this program will end.

Figure 28:
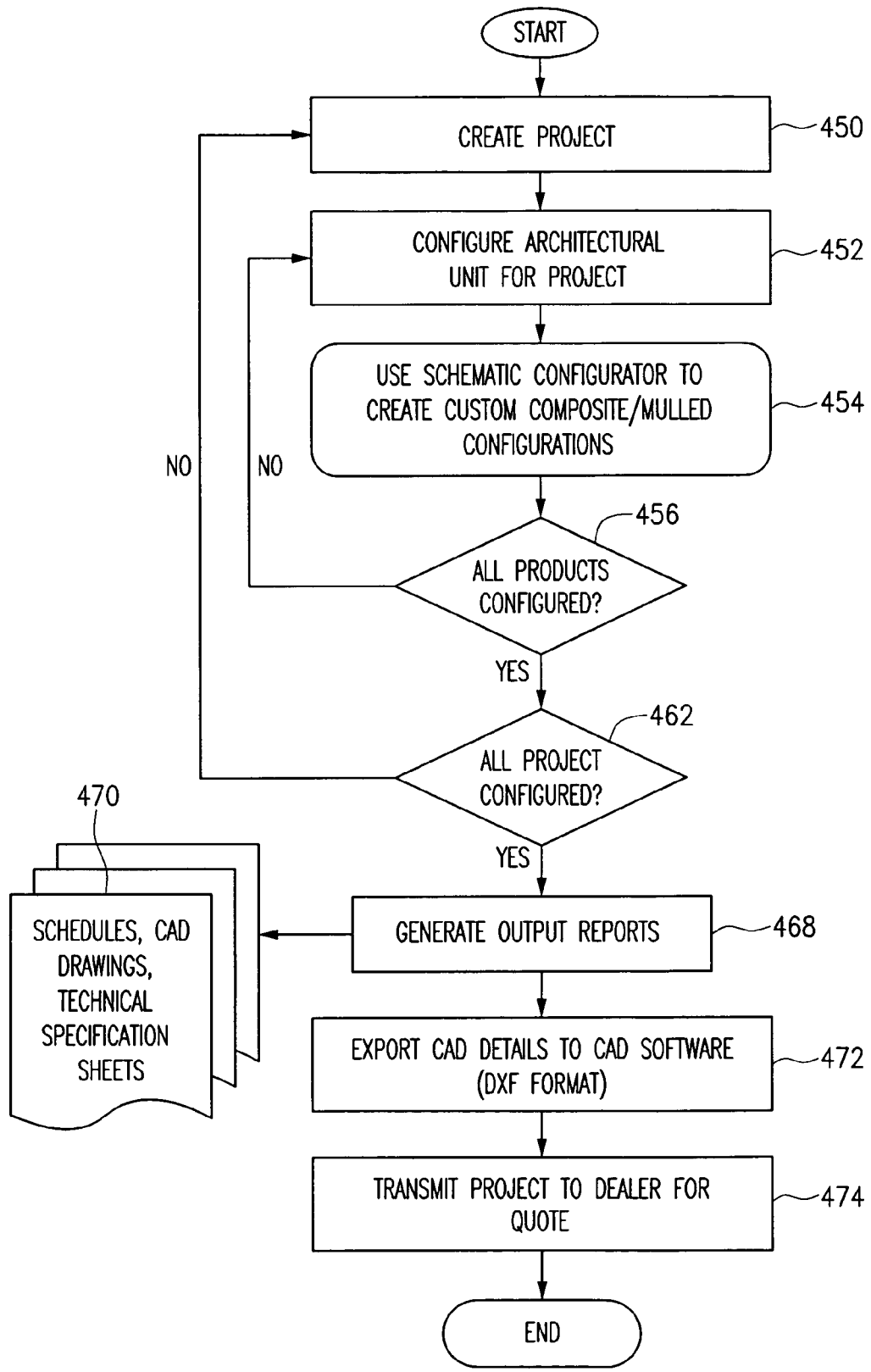
FIG. 28 is a flow diagram showing the architectural process for a millwork system in accordance with a preferred embodiment of the invention.

Another exemplary implementation of a preferred embodiment is shown in FIG. 28. Upon initiating a product customization, the user can create a project (step 450). A product can be selected (step 452) to be configured for that project. The product can be configured by accessing the Schematic Configurator (step 454) to create a custom composite product. This step 454 can be repeated until all the products for a specific project have been configured at step 456. Upon completion of configuration of all products for the project, additional projects may be created by returning to step 450. Once all projects have been created and all products for these projects have been selected and configured (step 462), the user moves on in the system by accessing the Generator for Output Reports (step 468), whereby schedules, CAD drawings, Technical Specification Sheets, etc. can be created as hard copies (step 470). After the generation of output reports, the user can export CAD Details to CAD software (step 472). Before exiting the system, the user can transmit the project and all related information regarding the project to a dealer for a price quote (step 474), which can also be printed as a hard copy.

Figure 29:
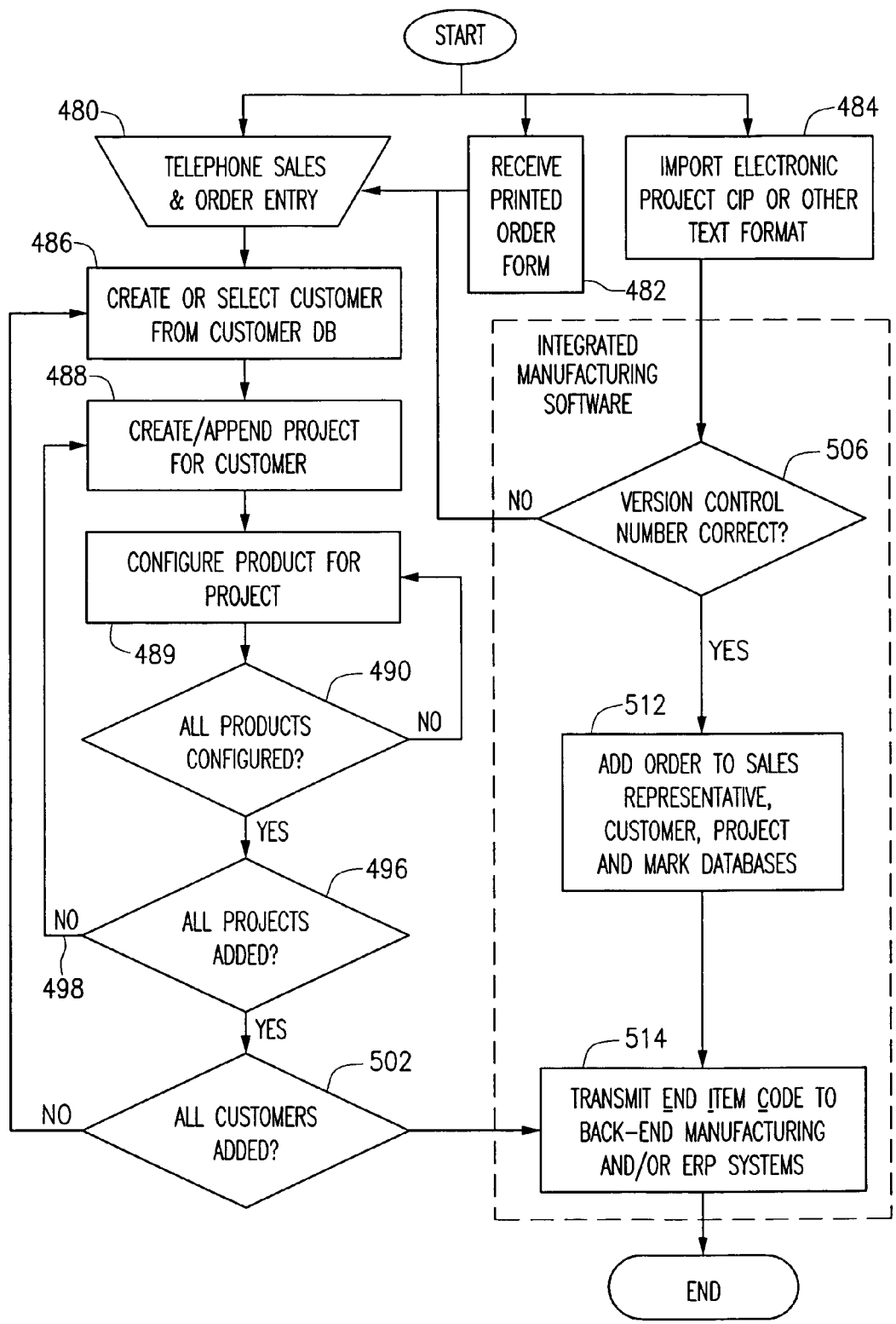
FIG. 29 is flow diagram illustrating the manufacturer use process in accordance with a preferred embodiment of the invention.

Another exemplary implementation of a preferred embodiment is shown in FIG. 29. In this exemplary embodiment, a user/sales-representative can initiate configuration of products in at least three ways: by taking a Telephone Sales and Order Entry (step 480), by Receiving a printed order form (step 482), and by Importing electronic project CIP (or other text format) (step 484). If a Printed order form is received (step 482), or Telephone Sales and Order Entry is taken (step 480), the sales-representative proceeds to create or select the customer from the Customer Database (step 486). Next the sales-representative can Create or Append a project for that customer (step 488). A desired product can be configured for that project (step 489). This step can be repeated until all the desired products for that customer or customer's project have been configured. Once all the products have been configured, the sales-representative can decide whether or not all the projects have been added for that customer (step 496). If they have not (step 498), the sales-representative can return to step 488 and create or access additional projects. If all the projects have been attended to, the sales-representative can determine if all customers have been added. If additional customers need to be added to the system or accessed within the system, the sales-representative can return to step 486 to create new files or select customers from the database, and then repeat the aforementioned steps. After all customers have been attended to, the user can transmit a product code (e.g., End Item Code) to back-end manufacturing and/or ERP systems before exiting the system.

If, as shown in FIG. 29, the user imports electronic Project CIP (or other text format), the user can access Integrated Manufacturing Software and move on to determine if the Version Control (VC) Number is correct in step 506. If not, the user can verify by telephone at step 480, and progress therefrom throughout the system as discussed above. If the VC Number is correct, the user can then add the order to any of the Sales Representative, Customer, Project, or Mark Databases (step 512). Next the user/sales-representative can Transmit the End Item Code to the back-end manufacturing and/or ERP systems (step 514).

Figure 30:
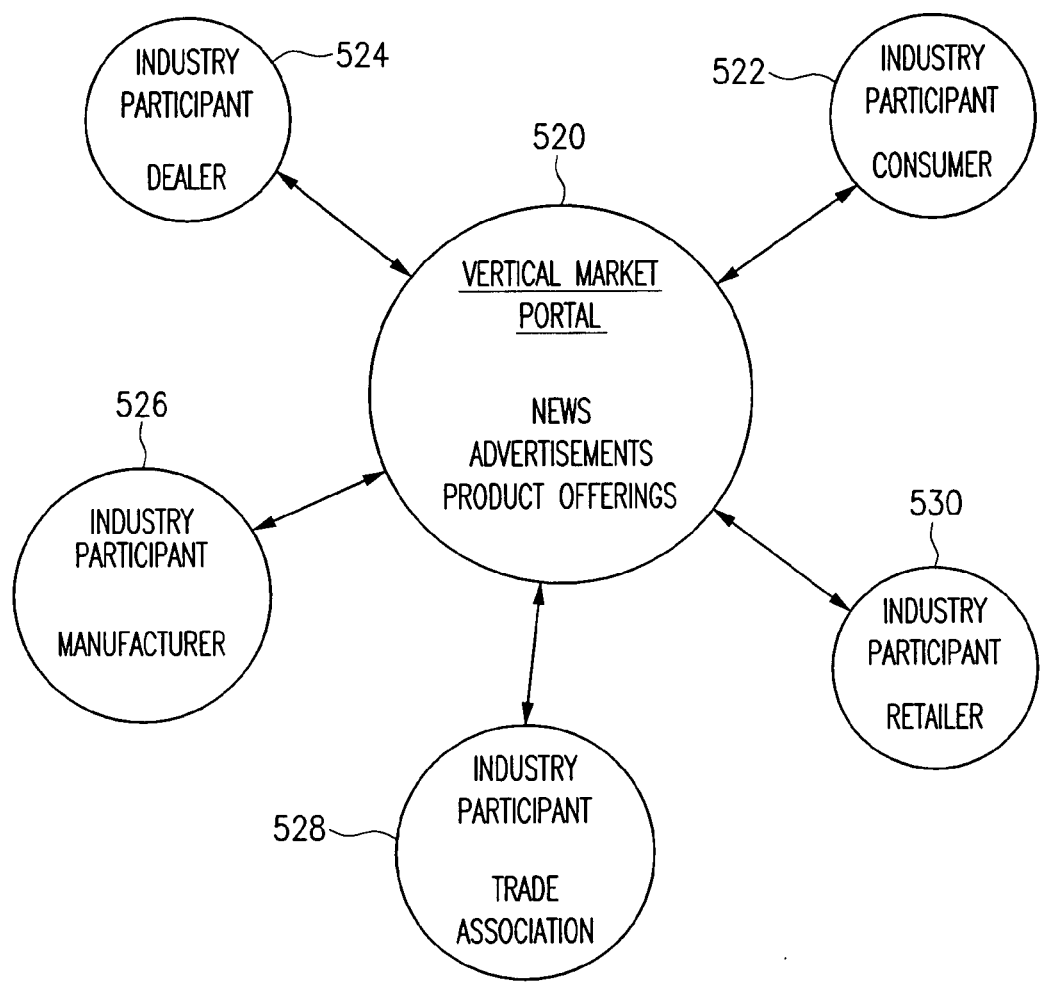
FIG. 30 is a diagram illustrating a configuration network, in accordance with a preferred embodiment of the invention.

In accordance with a preferred embodiment, the functions, features and architectures described above can be part of a network available to enable business-to-business commerce over the Internet. In accordance with a preferred embodiment of the invention, an Internet portal (and a corresponding method) is provided to be the center of a selected vertical market in a particular industry or collection of industries (e.g., fenestration, or windows and doors as exemplified above). The portal can be an Internet focal point for the participants in the vertical market. The portal can not only incorporate the configuration system described above for use by participants in the portal, but also can be a virtual space for industry news and information as well as a means for facilitating commerce by and between the participating manufacturers, dealers, distributors, and retail customers making up the vertical market, as shown in FIG. 30. In a preferred embodiment, Web server software such as Bondware by Bondware, Inc., which is a partially-owned subsidiary of EdgeNet. Inc., the details of which are incorporated herein by reference, may be used to implement the Internet portal.

The portal provides the central services for its participating members, providing news, advertisements, means for communication between members. The portal also provides a member-to-member commerce channel providing product offerings, configuration tools, ordering and purchasing mechanisms. Fees can be charged for membership to the portal, advertisements viewed or displayed on the portal, or as part of any member-to-member commerce transactions.

The portal can be an authoritative point of information about a given product market or focused to a specific group within the vertical market. The software package creating the portal can be a suite of Web applications enabling the creation of e-commerce communities for business customers. Virtual communities can be created through this portal where customers within the vertical market can shop, learn, play and explore common interests. This portal can incorporate the configuration-related system described heretofore. The portal can be accessible to those with market-specific expertise, and in return for membership in the portal, the participants can provide much of the content themselves in the form of advertising, news, discussions, sales, etc. as shown in FIG. 30.

In accordance with a preferred embodiment of the invention, one or more processor-based systems are used to implement the modules described or apparent from the description herein and to perform the functionality described (or inherent) herein. For each such system, one or more processors (e.g., central processing unit (CPU)) are provided for execution of one or more computer programs stored on any (one or more) known recording mediums. The processor(s) perform, control, or at least inform the various processing steps performed by the system in sending and retrieving data to and from at least one user interface and/or network. A user interface may be connected directly to a bus or remotely connected through a network (e.g., Internet). The network represents (wired or wireless) connection of two or more devices, whether directly or indirectly connected (e.g., directly coupling through cable, indirect coupling through one or more hubs or servers, whether the network is local to the processor-based system, geographically remote from the system, or a distributed combination of local/remote network components).

Preferably, one or more of the modules are coupled (directly or indirectly) to one or more database structures for use in supplying storage functionality for the modules in accordance with the operations described (or inherent) herein. The database structures can take any form from an individual floppy disk drive, hard disk drive, CD-ROM, redundant array of independent devices (RAID) system, to a network of the same or other storage devices. As is well known in the art, the database structures may be physically connected within the same location, or have one or more structures remotely located in different locations. Each module may have dedicated or shared access to one or more database structures locally or remotely located from the module.

While preferred embodiments of the invention have been described and illustrated, it should be apparent that many modifications to the embodiments and implementations of the invention can be made without departing from the spirit or scope of the invention. Although the configuration system (and corresponding method) has been specifically described in connection with the configuration of a window/door product, it should be apparent that the system (and method) can be applied to any product, service, or component that is to be designed or configured such as cabinets, rooms, houses, cars, landscape designs, clothing, etc.

While the illustrated embodiments have been described utilizing Internet communications, it should be readily apparent that other communication systems or (wired/wireless) networks (e.g., intranets, private bulletin boards, individual local or wide area networks, proprietary chat rooms, ICQ, IRC channels, instant messaging systems, etc.) using real-time or non-real-time systems in lieu of or in addition to the disclosed Internet resources may also be utilized.

Figure 7:
FIG. 7 is an exemplary illustration of multiple Product Code displays in accordance with a preferred embodiment of the invention.

A Pricing Engine module could be added to the configuration system to generate pricing and cost information for individual products, components, projects, etc. both on a real-time, on-going basis, as the user interacts with the system, and also to provide total (or sub-total) pricing data for the configured product or project. The Pricing Engine may include bid and quote generation functionality to facilitate the production and transmission of bid/quotes by users to their ultimate customers. A Product Code Engine (see FIG. 7) may be added to generate (and receive as inputs) codes (e.g., UPC, EIC, etc.) assigned by manufacturers, retailers, or other users, as well as by the system itself for use in processing data associated with a particular product, component, project, etc. The product codes may be used by other modules of the system (e.g., the Pricing Engine) to associate data (e.g., prices) directly with the product codes.

A Communications module can be added to streamline the sales, order entry and manufacturing process: from transaction sites through the plant and to the job site. Thus, for example, the user, sales representative, or other individual can place an order of the configured product/service directly with the provider (e.g., manufacturer). The communication can be accomplished through any known means of communication (e.g., telephone, fax, e-mail, Internet, etc.). The Communications module would provide the system with capability to transmit (e.g., fax) quotes to remote ordering locations.

A Specification Generator module may also be added to generate detailed specifications in textual and/or graphical format for the configured products/services, etc. The specifications may be displayed, output, exported, or transmitted as desired by the user.

The modules described herein, particularly those illustrated or inherent in the instant disclosure, may be one or more hardware, software, or hybrid components residing in (or distributed among) one or more local or remote computer systems. Although the modules are shown or described as physically separated components, it should be readily apparent that the modules may be combined or further separated into a variety of different components, sharing different resources (including processing units, memory, clock devices, software routines, etc.) as required for the particular implementation of the embodiments disclosed herein. Indeed, even a single general purpose computer executing a computer program stored on an article of manufacture (e.g., recording medium) to produce the functionality and any other memory devices referred to herein may be utilized to implement the illustrated embodiments. User interface devices may be any device used to input and/or output information. The user interface device may be implemented as a graphical user interface (GUI) containing a display or the like, or may be a link to other user input/output devices known in the art. Discrete functionality of the system may be separated (logically or physically) to more efficiently operate the system. Many of the fundamental data coordinating functions (e.g., functionality performed by Core 102) may be separated into a Foundation-Level Tools Subsystem. This Subsystem may include a BB Assist Module to create BB structures and the like.

In addition, memory units described herein may be any one or more known storage devices (e.g., Random Access Memory (RAM), Read Only Memory (ROM), hard disk drive (HDD), floppy drive, zip drive, compact disk-ROM, DVD, bubble memory, etc.), and may also be one or more memory devices embedded within a processor, or shared with one or more of the other components. The computer programs or algorithms described herein may easily be configured as one or more hardware modules, and the hardware modules shown may easily be configured as one or more software modules without departing from the invention. Accordingly, the invention is not limited by the foregoing description, drawings, or specific examples enumerated herein.

The invention claimed is:

1. A configuration system comprising:
a processor;
a user interface, wherein said user interface receives input data for a desired configuration; and a frame engine, receiving data input from said user interface, wherein said frame engine outputs configuration data to said user interface in response to a frame-based inference of the input data by examination of a hierarchical data tree structure having nodes whose components contain data relevant to various configurations and by removing appropriate portions of the data tree structure from consideration as input data is received for a desired configuration.

2. The system of claim 1, further comprising a database, coupled to said frame engine, storing configuration data selectively retrieved for output in response to inferences made by said frame engine.

3. The system of claim 2, wherein said frame engine subjects configuration data to be output to said user interface to pertinent rules-based inferences before being output to said user interface.

4. The system of claim 3, further comprising a rules engine, coupled to said frame engine, wherein said rules engine subjects selected configuration data to be output to said user interface to pertinent rules-based inferences before being output to said user interface.

5. The system of claim 2, wherein said frame engine represents data concerning configuration in a hierarchical structure, with frames corresponding to configuration categories, wherein the frames act as nodes of the hierarchical structure containing a collection of slots corresponding to configuration features and options.

6. The system of claim 5, wherein said database stores data representative of product knowledge pertaining to products that may be configured by the system.

7. The system of claim 2, wherein said database stores a plurality of questions for selective output to said user interface based on frame-based inferences made by said frame engine in response to answers input through said user interface.

8. The system of claim 7, further comprising: a data analysis subsystem performing analysis of configuration data to be output to said user interface; and a graphics formatting output subsystem providing graphical representations of configuration data output to said user interface.

9. The system of claim 8, wherein said data analysis subsystem comprises a pricing engine providing pricing data corresponding to configuration data output to said user interface.

10. The system of claim 8, wherein said graphics formatting output subsystem comprises a parametric drawing engine providing illustrations of configuration data to said user interface.

11. A method of configuring a project, the method comprising the steps of:
accessing a user interface;
initiating a project for configuration;
configuring the project by entering project selections;
performing a frame-based inference by examination of a hierarchical data tree structure having nodes whose components contain data relevant to various configurations and by removing appropriate portions of the data tree structure from consideration as project selections are entered, thereby to obtain inferences in response to project selections made in said configuring step; and
outputting project configuration data to the user interface based on the inferences made in said performing step.

12. The method of claim 11, wherein said configuring step involves answering a plurality of questions presented, wherein the questions to be presented during said configuring step are stored in a database and selected for presentation based on inferences made in said performing step.

13. The method of claim 12, wherein said configuring step further comprises the substep of presenting preferred answers to select questions presented on the user interface.

14. The method of claim 12, wherein said performing step further comprises the substep of performing a rules-based inference in response to project selections made in said configuring step.

15. The method of claim 11, wherein said configuring step further comprises the substeps of:
graphically selecting parameters to configure the project based upon graphic representations of variations of characteristics of components to be selected for the project; and
manipulating schematically configured illustrations of components to be selected for the project.

16. The method of claim 15, wherein the project to be configured includes a custom product, the method further comprising the steps of:
accessing a catalog page to display graphical and textual information pertinent to the product to be configured;
accessing a custom shapes editor to size a product upon configuration and to select a customized combination of dimensional parameters for said product;
accessing an accessories module containing product accessory information; and
producing technical specifications containing technical information regarding the project as configured;

17. An article of manufacture comprising a machine-readable storage medium having stored therein indicia of a plurality of machine-executable control program steps, the control program comprising the steps of:
accessing a user interface;
initiating a project for configuration;
configuring the project by entering project selections;

performing a frame-based inference by examination of a hierarchical data tree structure having nodes whose components contain data relevant to various configurations and by removing appropriate portions of the data tree structure from consideration as project selections are entered, thereby to obtain inferences in response to project selections made in said configuring step; and outputting project configuration data to the user interface based on the inferences made in said performing step.

18. The article of manufacture as recited in claim 17, wherein said performing step comprises the substep of representing data concerning configuration of the project in a hierarchical structure, with frames corresponding to configuration categories, wherein the frames act as nodes of the hierarchical structure containing a collection of slots corresponding to configuration features and options.

19. The article of manufacture as recited in claim 18, wherein said performing step comprises the substep of subjecting selected configuration data of the project to pertinent rules-based inferences.

20. The article of manufacture as recited in claim 18, wherein the substep of representing data concerning configuration of the project in a hierarchical structure comprises organizing nodes in a parent node and child node relationship, wherein each child node inherits attributes of a respectively associated parent node.

* * * * *